(12) United States Patent
Mohan

(10) Patent No.: US 7,102,449 B1
(45) Date of Patent: Sep. 5, 2006

(54) DELAY STAGE FOR OSCILLATOR CIRCUIT AND CORRESPONDING APPLICATIONS

(75) Inventor: Sunderarajan S. Mohan, Menlo Park, CA (US)

(73) Assignee: Barcelona Design, Inc., Mountain View, CA (US)

( * ) Notice: Subject to any disclaimer, the term of this patent is extended or adjusted under 35 U.S.C. 154(b) by 0 days.

(21) Appl. No.: 10/348,822

(22) Filed: Jan. 21, 2003

(51) Int. Cl.
  *H03B 5/04* (2006.01)

(52) U.S. Cl. ............................... 331/57; 331/17; 327/57
(58) Field of Classification Search ................ 331/57, 331/17; 327/57, 112
See application file for complete search history.

(56) References Cited

U.S. PATENT DOCUMENTS

| | | | |
|---|---|---|---|
| 4,884,041 A | | 11/1989 | Walker |
| 5,475,344 A | | 12/1995 | Maneatis et al. |
| 5,673,008 A | | 9/1997 | Sumita |
| 5,841,325 A | | 11/1998 | Knotts et al. |
| 6,005,448 A | | 12/1999 | Pickering et al. |
| 6,304,149 B1 | | 10/2001 | Kim |
| 6,329,849 B1 | * | 12/2001 | Czarnul et al. ............. 327/103 |
| 6,462,623 B1 | * | 10/2002 | Horan et al. ................... 331/17 |
| 2002/0136343 A1 | * | 9/2002 | Cranford et al. ............ 375/376 |
| 2003/0227333 A1 | * | 12/2003 | Schmitt et al. ............... 331/57 |

OTHER PUBLICATIONS

Seog–Jun Lee, Beomsup Kim and Kwyro Lee "A Novel High–Speed Ring Oscillator For Multiphase Clock Generation Using Negative Skewed Delay Scheme", IEEE Journal Of Solid–State Circuits, vol. 32, Feb. 1997, pp. 289–291.

Chan–Hong Park, .and Beomsup Kim, IEEE, "A Low Noise, 900–MHz VCO In 0.6um CMOS", IEEE Journal of Solid–State Circuits, vol. 36, No. 6, Jun. 2001, pp. 586–591.

Lizhong Sun and Tadeusz A. Kwasniewski, "A 1.25–GHz 0.35–um Monolithic CMOS PLL Based On A Multiphase Ring Oscillator", IEEE Journal of Solid–State Circuits, vol. 36, No 6, Jun. 2001, pp. 910–916.

Toby K. Kan, Gerry C.T. Leung and Howard C. Luong, "A 2–V 1.8–GHz Fully Integrated CMOS Dual–Loop Frequency Synthesizer", IEEE Journal of Solid–State Ciruits, vol. 37, No. 8, Aug. 2002, pp. 1012–1020.

* cited by examiner

*Primary Examiner*—Robert Pascal
*Assistant Examiner*—Joseph Chang
(74) *Attorney, Agent, or Firm*—Blakely, Sokoloff, Taylor & Zafman LLP

(57) ABSTRACT

An oscillator delay stage is described. The oscillator delay stage includes at least one differential input; a pair of single ended inverters for each differential input; and, a differential output. With respect to the pair of single ended inverters for each differential input, each pair of single ended inverters further include for their corresponding differential input: i) a first single ended inverter whose input is coupled to a + input of the corresponding differential input; and, ii) a second single ended inverter whose input is coupled to a – input of the corresponding differential input. With respect to the differential output, the differential input further includes: i) a + output that is coupled to each said second single ended inverter output; ii) a – output that is coupled to each said first single ended inverter output.

44 Claims, 14 Drawing Sheets

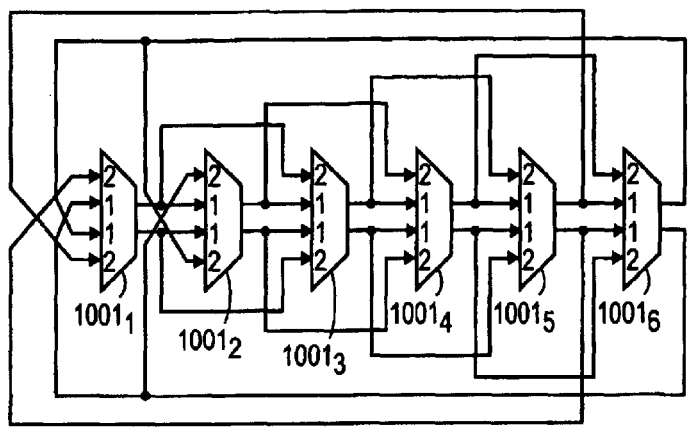
FIG. 10A
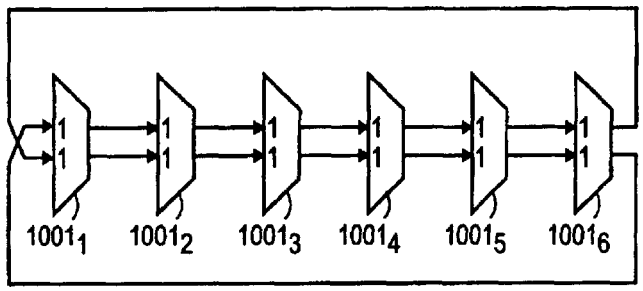
FIG. 10B
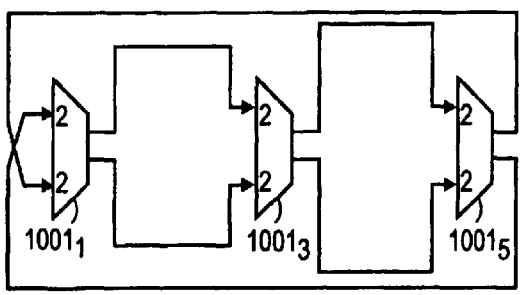
FIG. 10C
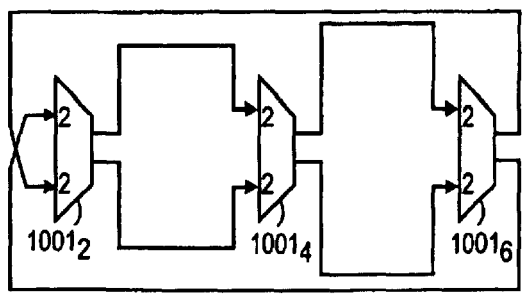

DELAY STAGE FOR OSCILLATOR CIRCUIT AND CORRESPONDING APPLICATIONS

This application is hereby cross-referenced to the following related patent application, U.S. Pat. application Ser. No. 10/348,723, filed on Jan. 21, 2003, entitled, Methodology For Design Of Oscillator Delay Stage and Corresponding Applications, by Sunderarjan S. Mohan.

FIELD OF INVENTION

The field of invention relates generally to electronic circuit design; and, more specifically, to a delay stage for an oscillator circuit and corresponding oscillator design methodology.

BACKGROUND

An oscillator is a circuit that is designed to generate an oscillating waveform. FIG. 1a shows a generic single-ended oscillator circuit that is designed as a "loop" of single ended inverters 101 through 103. Here, note that an odd number of inverters 101 through 103 causes an inherent instability; which, in turn, produces an oscillating waveform 105 at the output node 104 of the oscillator. That is, a "high" at the input of inverter 101 causes a "low" to be presented to inverter 102; which, in turn, causes a "high" to be presented to inverter 103. This causes a "low" to appear at both the output node 104 of the oscillator and the input of inverter 101. Here, in a manner inapposite to that described just above, the "low" presented to inverter 101 will cause a "high" to appear at the output node 104.

As such, the voltage level at output node 104 is inherently unstable which corresponds to the production of an oscillating waveform 105 as drawn in FIG. 1a. The frequency of oscillation of the output waveform 105 can be generically described as $1/(2NP_D)$ where N is the number of inverters in the oscillator (i.e., N=3 in the oscillator embodiment of FIG. 1a) and $P_D$ is the propagation delay through any one of inverters 101 through 103 (where each inverter 101 through 103 is assumed to have the same propagation delay $P_D$). FIG. 1b shows a typical single ended inverter that can be used to implement each of inverters 101 through 103 of FIG. 1a.

In many applications, however, a differential (rather than single-ended) oscillating signal is desired. A differential signal includes a pair of signals (a "+" signal and a "−" signal) where each signal acts as the opposite of the other (i.e., when the "+" signal is "high" the "−" is low and when the "+" signal is "low" the "−" signal is "high"). An example of a differential signal 205 is shown in FIG. 2a by the pair of waveforms observed therein. A differential oscillator circuit can be configured by designing a "loop" of differential inverters 201 through 203 as observed in FIG. 2a. The operation of the differential oscillator of FIG. 2a is much the same as the operation of the operation single ended oscillator of FIG. 1a, except that the differential nature of the inverters 201 through 203 observed therein cause the automatic production of a differential output signal. A typical differential inverter circuit that can be used for each of inverters 201 through 203 is observed in FIG. 2b.

A problem with the use of a differential inverter circuits like the differential inverter circuit observed in FIG. 2b is that they tend to consumer more power than the single ended inverter structure of FIG. 1b (because of current source 206); and, moreover, exhibit reduced output signal swing as compared to the single ended inverter structure of FIG. 1b (because of the current source-transistor-resistor totem pole structure observed in FIG. 2b). As such, it a design application is sensitive to these drawbacks, a designer may be motivated to attempt a different oscillator circuit approach than that observed in FIGS. 2a and 2b if a differential oscillating signal is desired.

One such approach, referred to as "pseudo-differential", employs (in the simplest case) the use of a pair of "single ended" channels to effectively create a differential signal (or near differential signal) while still enjoying some of the functional enhancements associated with single ended inverter structures (e.g., reduced power consumption and larger output signal swing). FIG. 3 shows an embodiment of a basic pseudo-differential oscillator circuit. Note that that the oscillator of FIG. 3 is constructed with neighboring pairs 301 through 304 of single ended inverters. A pair of relatively isolated single ended channels (as observed in FIG. 3) is generally not used in practice because the oscillator output might behave as a two separate signals (i.e., the output signal departs from being sufficiently differential (e.g., because the pair of output signals have an unacceptable frequency and/or phase difference).

In order to enhance the differential quality of a pseudo-differential output signal, more sophisticated pseudo-differential oscillators are designed with a series of "delay stage" that each posses internal "cross-coupling". FIG. 4a shows a pseudo-differential oscillator constructed with four delay stages 401 through 404. FIG. 4b shows an embodiment of a delay stage that may be used for each of the delay stages 401 through 404 of FIG. 4a. Note that the delay stage embodiment of FIG. 4b includes single ended inverter-like structures 406 and 407 in order to: 1) preserve the lower power consumption and high output signal swing functional characteristics that single ended inverter structures provide; and, 2) approximately implement the neighboring "single ended" channel architecture associated with a psuedo-differential oscillator approach.

The delay stage of FIG. 4b also possesses internal "cross-coupling" between its input-to-output paths. Cross coupling is a crossover between + and − signal paths (e.g., from input to output) within a delay stage. Unfortunately, although cross-coupling helps a pseudo-differential oscillator maintain a sufficiently differential output signal, at the same time, cross-coupling tends to "slow down" the output signal of the oscillator circuit to a frequency of oscillation that is less than that which could have been realized if cross-coupling had not been used. In order to offset this effect "multi-input" delay stages may be used. FIGS. 4a and 4b also correspond to an multi-input delay stage implementation.

The multi-input aspect of delay stages 401 through 404 is utilized, in the pseudo-differential oscillator circuit of FIG. 4a, such that each delay stage provides a direct input not only to its immediately following delay stage but also to its second immediately following delay stage. For example, delay stage 401 not only provides a signal directly to delay stage 402 but also to delay stage 403; delay stage 402 not only provides a signal directly to delay stage 403 but also to delay stage 404;, etc., As alluded to above, using multiple inputs in this manner helps to reduce the frequency loss associated with the cross coupling between signal paths within the delay stages. Thus, at least for field effect transistor (FET) technologies, a pseudo-differential oscillator having multiple input delay stages is a circuit that should produce a sufficiently differential oscillating output signal while exhibiting: 1) higher frequency operation; 2) reduced power consumption; and, 3) larger output signal swing.

Unfortunately, because of the various round trip paths through the oscillator that are introduced by the multiple inputs per delay stage and the instance(s) of cross-coupling within each delay stage, the precise nature of operation for a pseudo differential multi input delay stage oscillator is difficult to characterize or quantify. For example, even though cross coupling helps to prevent an oscillator circuit from reaching a latched state (a condition wherein the inherent instability in the output signal is lost resulting in a constant "DC" output signal rather than an oscillating output signal) under many circumstances, nevertheless, it remains difficult to characterize or quantify a set of conditions wherein the latched state can arise (i.e., is possible) or cannot arise (i.e., is impossible).

Similarly, even though cross coupling helps to form a sufficiently differential output signal under many circumstances, nevertheless, it remains difficult to characterize or quantify a set of conditions wherein the differential quality of the output signal will be well within an acceptable realm or will depart from being within an acceptable realm (e.g., in an extreme case of unacceptable behavior, referred to as "common mode oscillation", the "+" and "−" signals are duplicates of one another rather than being opposite of one another (i.e., are in-phase rather than out-of-phase).

Given that oscillator circuits are specialized circuits that are often designed to "work" (e.g., meet certain speed, power consumption, signal quality requirements) within a specified range of possible applicable "conditions" (e.g., supply voltage, temperature, manufacturing process tolerances), it behooves a designer to be able to better characterize the nature of operation for a multi input delay stage based pseudo-differential oscillator circuit so that its general behavior as well as its ability to avoid certain detrimental modes of operation (e.g., latched state, common mode oscillation, etc.) can be specially designed for.

FIGURES

The present invention is illustrated by way of example and not limitation in the accompanying figures.

FIG. 6a shows an M=2 embodiment of the multi-input delay stage circuit observed in FIG. 5a;

FIG. 7 shows a methodology for designing a multi-input delay stage based pseudo-differential oscillator circuit such as the new multi-input delay stage based pseudo-differential oscillator circuit observed in FIG. 5a;

Figure 9B:
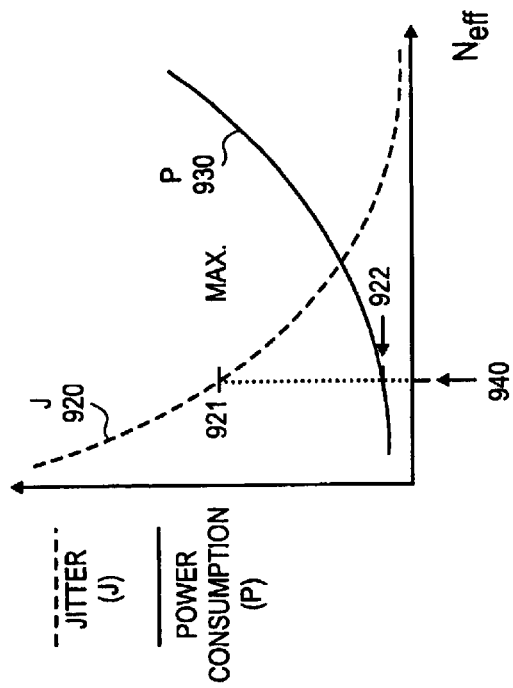
Figure 9A:
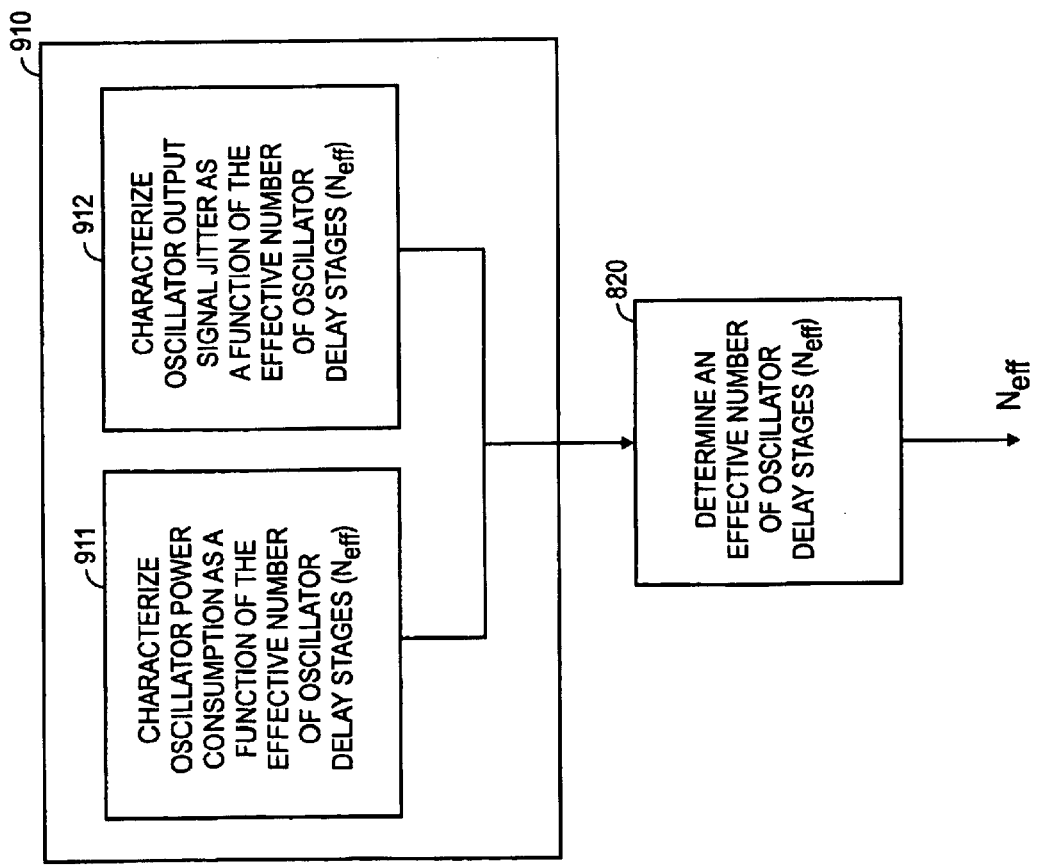

FIG. 9a elaborates on a possible approach for at least partially determining and/or defining an oscillator's constraints through the use of an effective number of stage parameter (Neff).

Figure 5A:
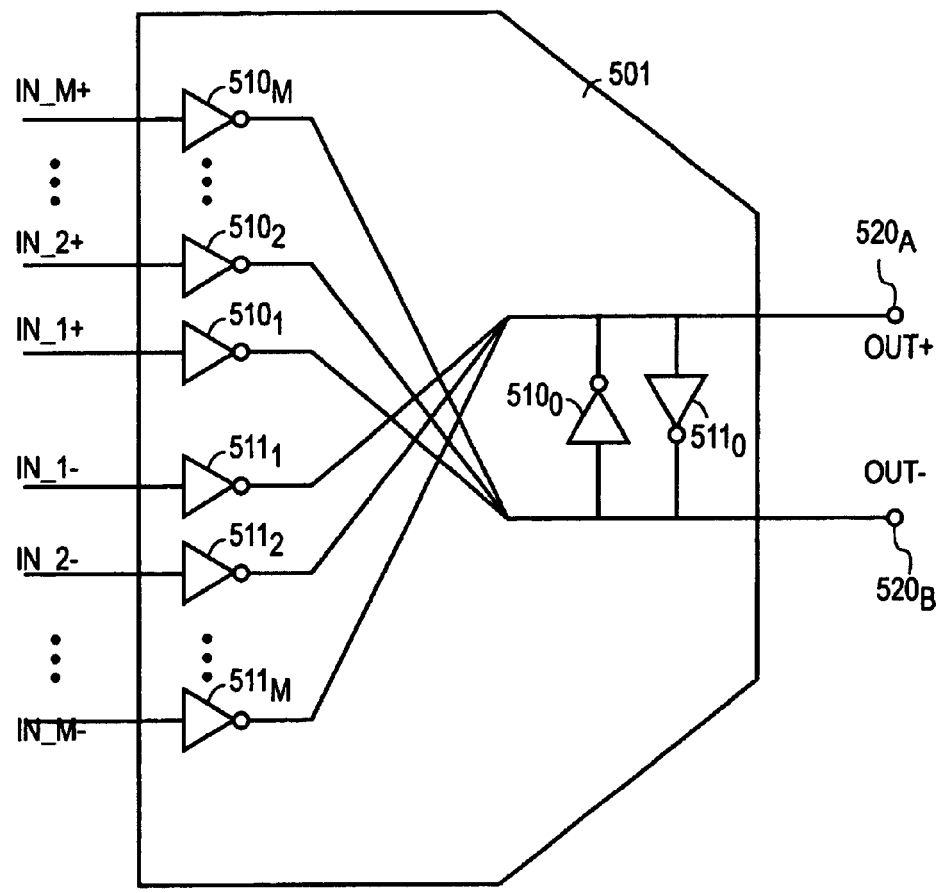
FIG. 5a shows a generic depiction of a multi-input delay stage circuit which is an aspect of the invention.
Figure 7:
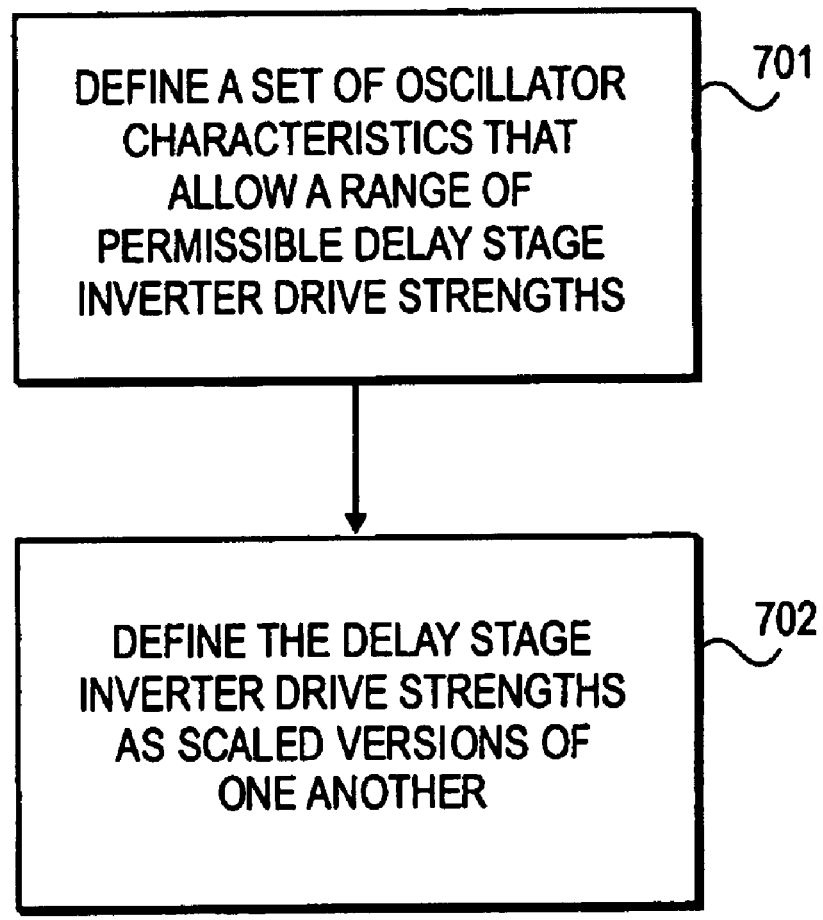
Figure 11:
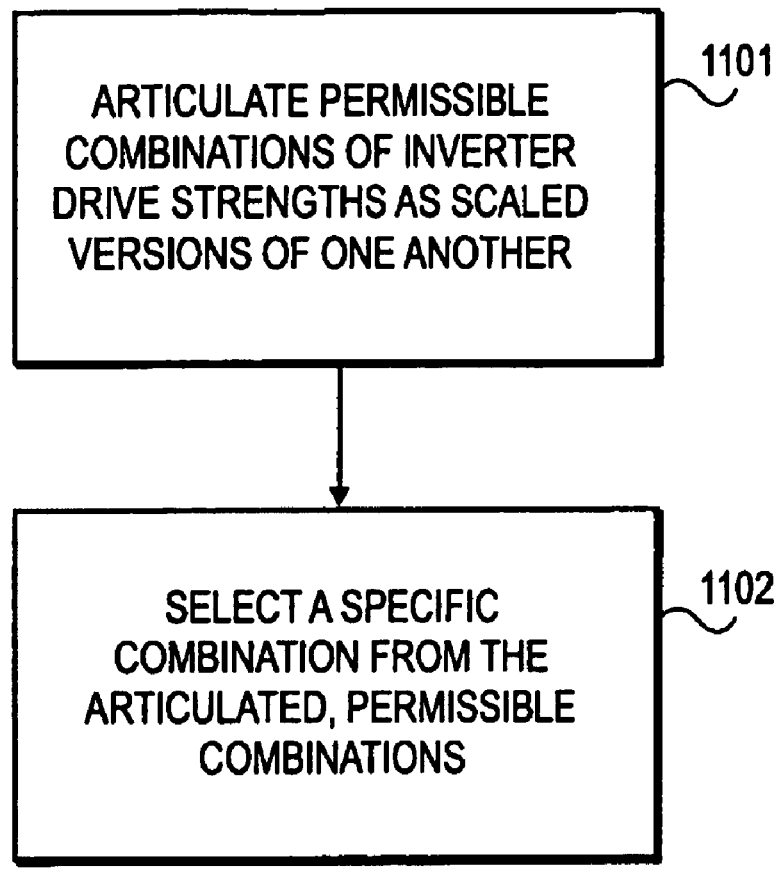
Figure 12:
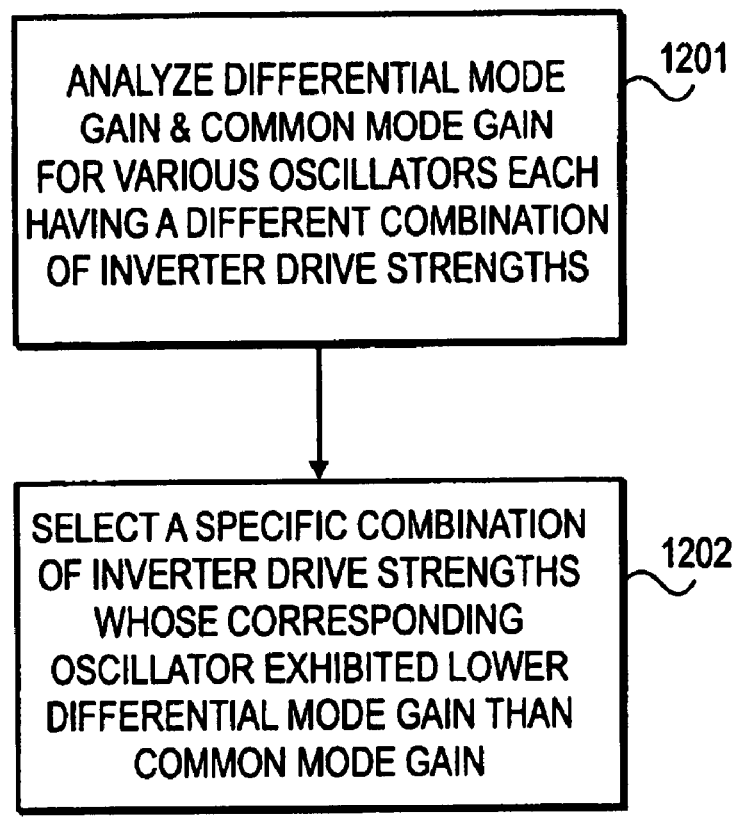
Figure 13A:
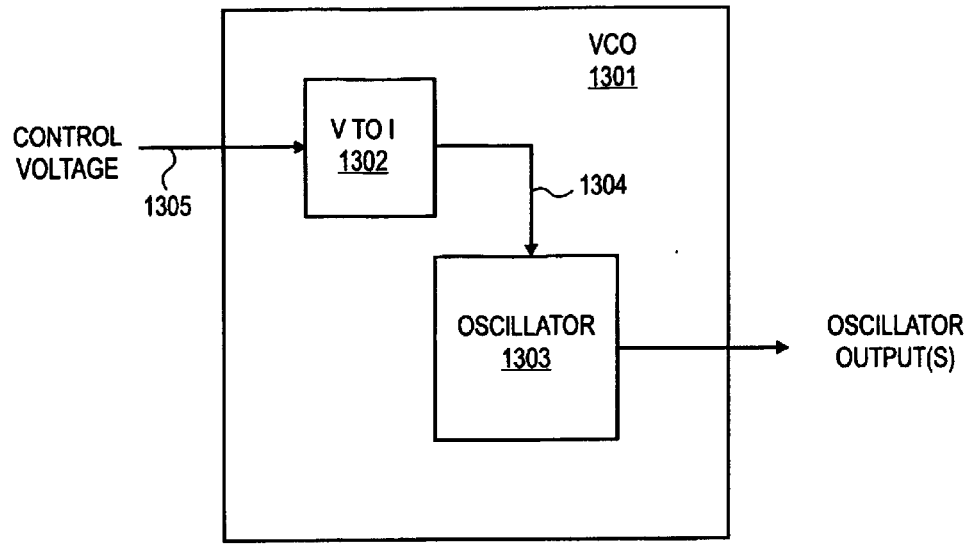
Figure 13B:
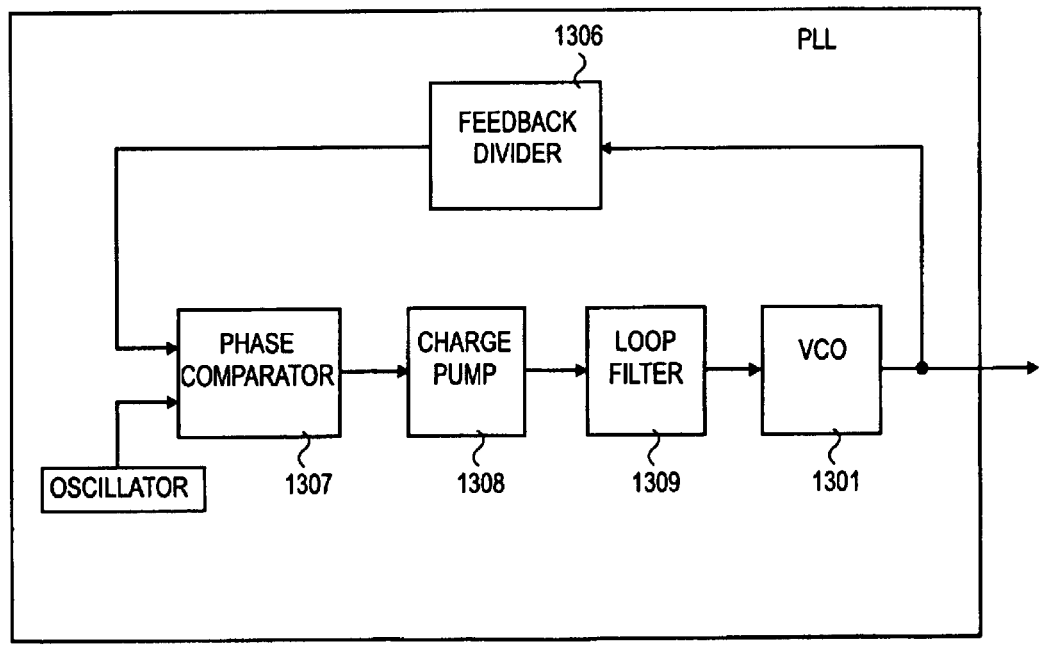
Figure 14:
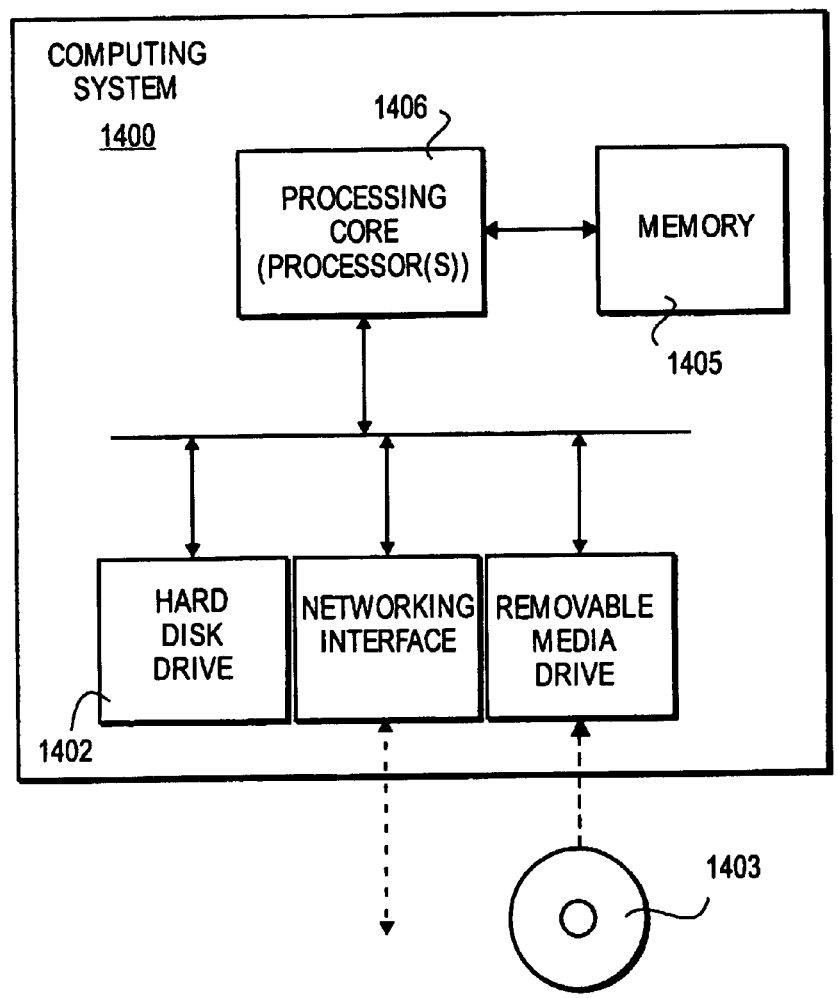

FIG. 9b shows an exemplary depiction of jitter (J) and power consumption (P) vs. Neff for an oscillator;

FIG. 10a shows an N=6, M=2 embodiment of the multi-input delay stage based pseudo-differential oscillator circuit observed in FIG. 5a;

FIG. 10b shows a "first" oscillation path that exists within the oscillator circuit observed in FIG. 9a;

FIG. 10c shows a pair of "second" oscillation paths that exist within the oscillator circuit observed in FIG. 10a;

FIG. 11 shows an embodiment of a methodology for defining the inverter drive strengths of a delay stage as scaled versions of one another (as originally depicted in FIG. 7);

FIG. 12 shows a methodology for selecting a specific combination of k values from a family of permissible k value combinations;

FIG. 13a shows a voltage controlled oscillator;

FIG. 13b shows a phase-locked-loop circuit;

FIG. 14 shows a depiction of a computing system.

DETAILED DESCRIPTION

A. Overview

FIG. 5a provides a generic depiction of a multi-input delay stage circuit that may be used for each delay stage in an oscillator design. As described in more detail in the description that follows, an oscillator that is designed with the delay stage approach of FIG. 5a can be designed (by articulating the relative drive strengths of the delay stage inverters $510_0$ through $510_M$ and $511_0$ through $510_M$ as scaled versions of one another) to have a propensity maintaining a differential mode of oscillation (e.g., by sufficiently rejecting a latched state or a common mode of oscillation). As such, the uncertainty mentioned at the end of the Background section can be significantly reduced. Moreover, because propensity toward differential oscillation and away from common mode oscillation can be articulated in terms of the relative drive strength of each delay stage inverter, a special design strategy may be employed.

More specifically, referring briefly ahead to FIG. 7, by first defining a set of oscillator characteristics 701 (e.g., defining specific values for each of supply voltage, manufacturing process parameters, number of delay stages, oscillation frequency, power consumption, jitter, etc.) that nevertheless allow a range of delay stage inverter drive strengths to still be entertained, the inverter drive strengths may be later defined 702 as scaled versions of one another so as to enhance the oscillator's propensity toward a differential mode of oscillation. Thus the following discussion describes both a novel oscillator delay stage (and oscillator architectures) as well as a novel oscillator design methodology.

B. Delay Stage and Possible Oscillator Designs

The delay stage of FIG. 5a (and a possible generic oscillator architecture that makes use of the delay stage of FIG. 5a) will be presently described. The ability to articulate the oscillator's propensity toward differential oscillation (while staying away from common mode oscillation) in terms of the relative drive strengths of the delay stage inverters will become evident through a following discussion of the design methodology; and, therefore, relationships between these oscillator properties and inverter drive strength will be provided in more detail further below. Presently, FIGS. 5a, 5b, 6a and 6b will be used as a basis for describing the delay stage and some possible oscillator implementations that make use of the oscillator delay stage observed in FIG. 5a.

Before commencing such a discussion, however, it is important to recognize that part of the significance of the design methodology discussed below is that identically configured delay stages can be used to implement an overall oscillator. That is, an oscillator's tendency to refrain from a latched state or a common mode of oscillation can be articulated in terms of the relative drive strengths of the inverters $510_0$ through $510_M$ and $511_0$ through $511_M$ within a single delay stage. Once these relative drive strengths within a single delay stage are defined, an oscillator can be constructed by implementing an appropriate number of identically designed delay stages (i.e., where each delay stage possesses the same relative drive strengths as between its own, internal inverters).

According to FIG. 5a, each delay stage within an oscillator includes M differential inputs (making a total of 2M signal inputs). Each input signal is inverted by a single ended inverter and routed to its opposite differential end in order to help form one of the delay stage's output signals (e.g., input signal IN_1+ is inverted by inverter $510_1$ to help form the "−" end of the delay stage output signal that is provided at output node 520b; input signal IN_2− is inverted by inverter $511_2$ to help form the "+" end of the delay stage output signal that is provided at output node 520a). The routing to an opposite signal end corresponds to internal cross coupling within the delay stage. Note that additional "cross-coupling" inverters $510_0$, $511_0$ may be applied at the designer's option (depending on the desired strength of a delay stage's internal cross coupling).

Figure 1A:
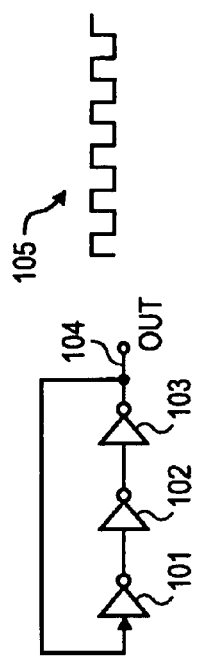
FIG. 1a (prior art) shows a depiction of a single ended oscillator circuit.
Figure 1B:
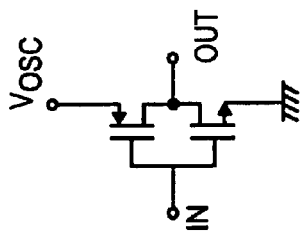
FIG. 1b (prior art) shows a single ended inverter circuit.

For CMOS FET based implementations, each of inverters $510_0$ through $510_M$ and inverters $511_0$ through $511_M$ may be implemented with a standard inverter such as the basic inverter structure observed in FIG. 1b. Note that the drive strength of such an inverter (being a measure of it's output current source/since magnitude) is a function of the gate width of its constituent transistors (where larger gate width results in greater drive strength and where gate width is measured in a direction that is perpendicular to current flow through the transistor). More generally (e.g., as applied to alternative technologies such as bipolar), an inverter's drive strength can usually be regarded as a function of transistor size and doping. Moreover, in general, each inverter should be designed so as to have equal (or approximately equal) rise and fall times. Here, in many CMOS FET embodiments, this condition is satisfied by making the width of the P type transistor a fixed constant of the N type transistor (i.e., Wp=kWn where k>1 (and usually 3>k>2 for most CMOS manufacturing processes) when the gate length of the pair of transistors are the same).

Figure 5B:
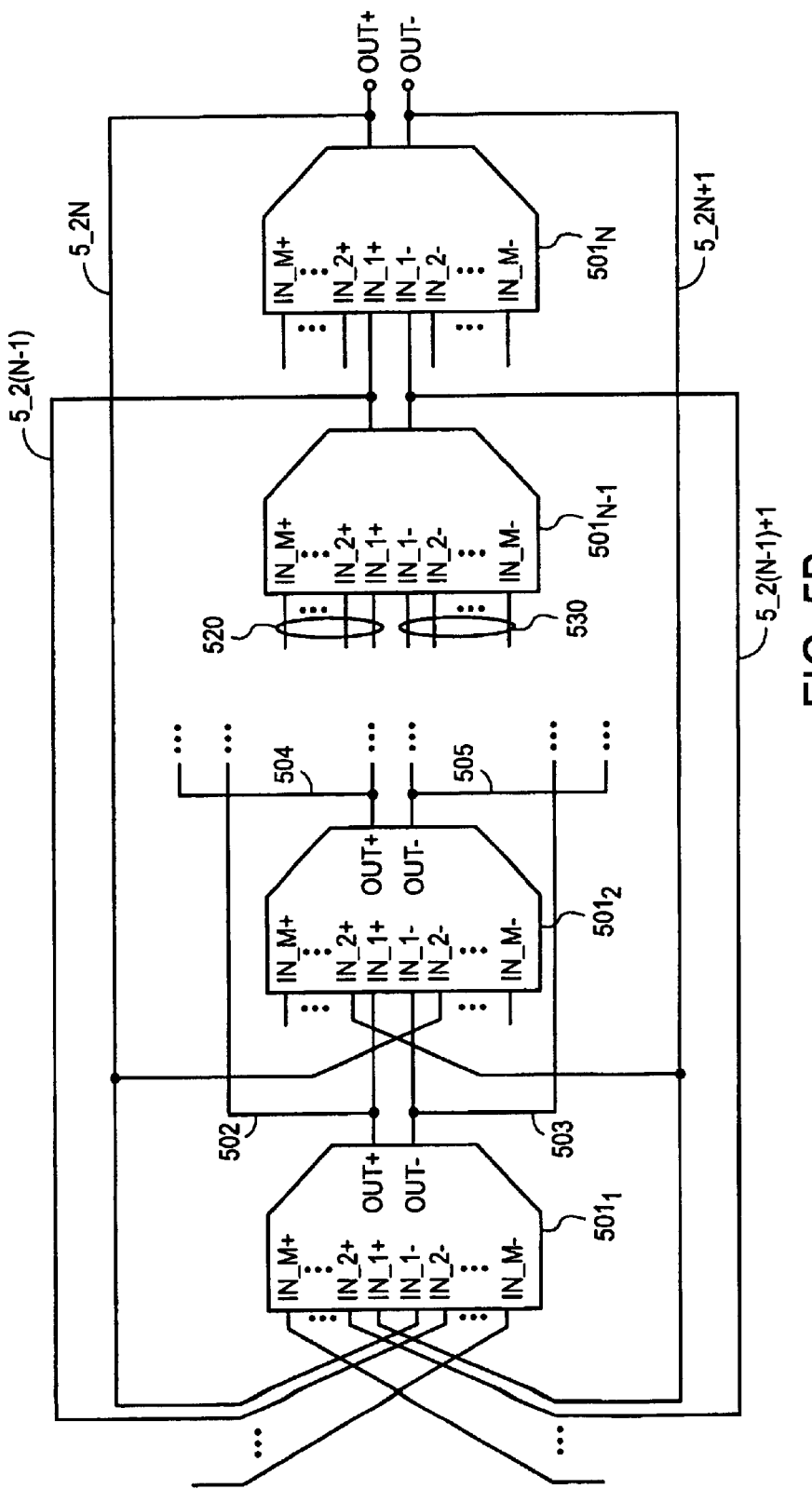
FIG. 5b shows a generic depiction of a multi-input delay stage based pseudo-differential oscillator circuit that may be constructed with the multi-input delay stage circuit observed in FIG. 5a and depicts another aspect of the invention.

An oscillator constructed with the delay stage of FIG. 5a should be designed so that: 1) each delay stage provides its output signal to each of the "next" M following delay stages (where M is the number of differential signal inputs per delay stage); and, 2) for each delay stage that a delay stage output signal is provided to, a different differential input level is used. An example of each of these design principles is observed in FIGS. 5b and 6b. Here, FIG. 5b illustrates a generic oscillator architecture of N delay stages $501_1$ through $501_N$ each having M differential inputs (i.e., M "+" input signals and M "−" input signals). Note that a large class of designs exists where N≧1 and N−1≧M≧1.

Figure 6A:
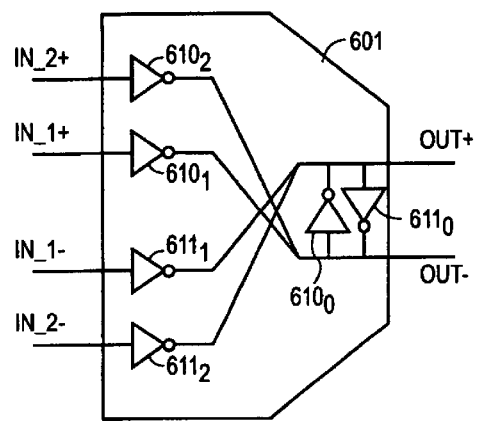
Figure 6B:
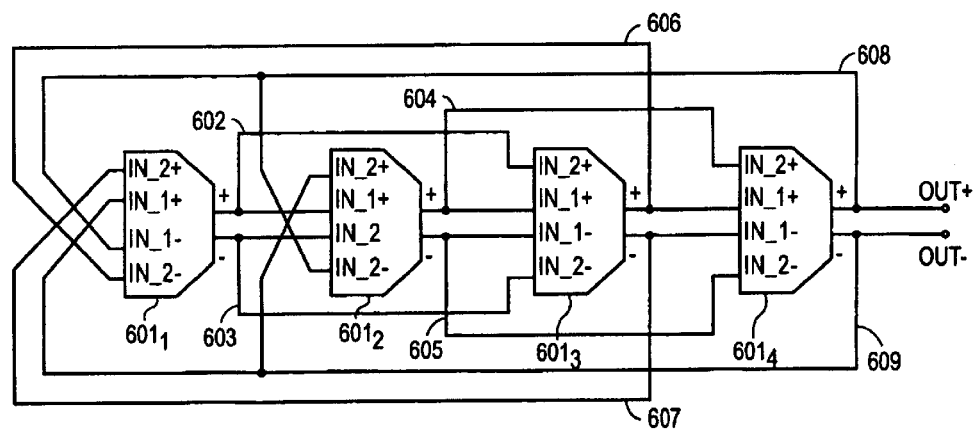
FIG. 6b shows an N=4, M=2 embodiment of the multi-input delay stage based pseudo-differential oscillator circuit observed in FIG. 5b.

FIG. 6b illustrates an N=4, M=2 oscillator that conforms to the approach of FIG. 5b. Referring to FIG. 6b, with respect to the first of the design constraints enumerated above, note that each delay stage $601_1$ through $601_4$ provides its pseudo-differential output signal to its immediately following delay stage and its next immediately following delay stage (i.e., delay stage $601_1$ provides its pseudo-differential output signal to delay stages $601_2$ and $601_3$ (via signal lines 602, 603), delay stage $601_2$ provides its pseudo-differential output signal to delay stages $601_3$ and $601_4$ (via signal lines 604, 605), delay stage $601_3$ provides its pseudo-differential output signal to delay stages $601_4$ and $601_1$ (via signal lines 606, 607); and, delay stage $601_4$ provides its pseudo-differential output signal to delay stages $601_1$ and $601_2$ (via signal lines 608, 609). Here, as the exemplary oscillator architecture of FIG. 6b corresponds to an M=2 oscillator architecture, as described just above, each delay stage drives its following "two" delay stages.

More over, in conformance with the second design constraint enumerated above, note that an immediately following delay stage within the oscillator of FIG. 6b receives an output signal at its primary inputs "IN_1+/−" and a next immediately following delay stage receives the output signal at its secondary inputs "IN_2+/−". That is, for example, the differential output signal of delay stage $601_1$ is applied to: 1) the primary inputs IN_1+/− of delay stage $601_2$ and, 2) the secondary inputs IN_2+/− of delay stage $601_3$. Thus, as can be seen from this example, the output signal from a particular delay stage (e.g., delay stage $601_1$) is applied to different differential levels (primary vs. secondary) of the delay stages that it is provided to (delay stages $601_2$ and $601_3$).

In this respect, note that another large class of oscillator designs exist where the further "downstream" a recipient delay stage is, the "higher" the order of the differential input employed. Said another way, if the differential inputs are defined according to M different orders defined by IN_i+/− where i=1, 2, . . . M (where i=1 corresponds to the primary inputs IN 1+/−; i=2 corresponds to the secondary inputs IN 2+/−, etc.); then, i increases the further downstream a receiving delay stage resides from a particular delay stage output. The exemplary oscillator architecture of FIG. 5b corresponds to such an approach where a delay stage output is provided to each of the following M delay stages; and, m increases by 1 for each "next" downstream delay stage. The oscillator of FIG. 6b provides a simple, further example where M=2; and, as such, from the perspective of the output of a particular delay stage (e.g., delay stage $601_1$), the immediately following delay stage (e.g., delay stage $601_2$) receives the corresponding output signal at its primary input (i.e., i=1); and, the next immediately following delay stage (e.g., delay stage $601_3$) receives the corresponding output signal at its secondary input (i.e., i=2).

C. Design Methodology

As mentioned in Section A, and referring now to FIG. 7, an oscillator designed with the delay stage approach observed in FIG. 5a can be designed so as to have a certain propensity toward differential mode oscillation and away from common mode oscillation by: 1) defining 701 a set of oscillator characteristics that allow a degree of freedom with respect to the drive strengths of the delay stage inverters; and then, 2) defining 702 the drive strengths of the delay stage inverters as scaled versions of one another. The initial defining 701 of a set of oscillator characteristics corresponds to specifying design topology and functional characteristics of the oscillator in a manner that allows the overall design challenge to still entertain a range of "workable" inverter drive strengths. As such, the initial definition of the oscillator 701 acts as a pre curser to the defining 702 of the delay stage inverter drive strengths themselves.

Here, recalling that it has been traditionally difficult to quantify the ability of a multi input delay stage pseudo-differential oscillator to maintain a sufficiently suitable differential mode of operation (e.g., "by staying away from" both a latched state and a common mode of oscillation), it has been discovered that the relative drive strengths of the delay stage inverters with respect to one another have significant influence over the "strength" of an oscillator's differential mode of operation. Moreover, it has been further discovered that by intelligently defining the drive strengths of the delay stages as scaled versions of one another, a designer (or a design process) can craft an oscillator having a specific propensity toward differential oscillation and away from common mode oscillation.

Consistent with this perspective, the design methodology of FIG. 7 therefore attempts to first define 701 the oscillator to be designed in terms of properties that do not cause the relative drive strengths of the delay stage inverters to be strictly specified. Better said, the oscillator 701 is first defined at a level that still allows a degree of freedom or "play" in the field of permissible relative inverter drive strengths. As a consequence of partially specifying the oscillator while preserving a degree of freedom with respect to "workable" relative inverter drive strengths 701; during a subsequent design stage 702, the designer (or design process) will be able to: 1) analyze the effect(s) of the relative inverter drive strengths on the oscillator's propensity toward differential and common mode oscillation; and/or, 2) select a specific set of relative inverter drive strengths that result in the designed oscillator having a natural tendency to reject common mode oscillation and embrace differential mode oscillation.

C.1. Initial Definition of Oscillator Characteristics

Here, according to at least one approach, the initial definition 701 of the oscillator's characteristics includes: 1) defining the number of delay stages (N) the oscillator is to have); 2) defining a specific oscillation frequency (e.g., in radians/sec: $\omega_{osc}$) the oscillator is to have for a specific oscillator supply voltage ($V_{osc}$); and, 3) defining the particular semiconductor manufacturing process that will be used to construct the oscillator. Each of these should be able to be defined early on in the oscillator design process.

For example, a Phase-Lock-Loop (PLL) circuit (which makes use of a voltage controlled oscillator circuit) may be designed as the primary clock signal source for a larger semiconductor chip that the PLL itself is integrated onto. Here, the output frequency of the PLL (which corresponds to the frequency of oscillation $\omega_{osc}$ of the PLL's oscillator output signal) can be specified in accordance with the understood speed of operation of the circuitry that resides on the semiconductor chip. For example, as just one possible instance, an 800 Mhz logic core may be designed to require a 1.6 GHz clock signal. As such, the oscillation frequency of the PLL's oscillator is understood at the onset to have a "nominal" output signal oscillation frequency of $\omega_{osc}/(2\pi)=$ 1.6 GHz. The oscillator may be further defined such that it exhibits its "nominal" output signal oscillation frequency when the oscillator supply voltage $V_{osc}$ reaches a specific "nominal" operating voltage (e.g., half the power supply voltage (Vcc) provided to the PLL itself (i.e., Vcc/2).

Moreover, because the semiconductor manufacturing process which will be used to manufacture the semiconductor chip (e.g., "the IBM 0.13 um process", or "the TSMC 0.13 um process", etc.) should be able to be defined toward the start of the design process, the basic achievable propagation delay (e.g., $P_D$ as described in the Background) of a delay stage that is built with the manufacturing process should also be quantifiable early on in the PLL's/oscillator's design. For example, for a basic inverter structure such as the basic inverter structure of FIG. 1B, the propagation delay through the inverter is largely a function of the transistor gate length; whose minimum dimension, in turn, is largely a function of the underlying semiconductor manufacturing process. From the basic propagation delay through an inverter, the basic propagation delay through a delay stage can be grasped.

By considering both the desired oscillation frequency ($\omega_{osc}$) and the achievable propagation delay of a delay stage, the number of delay stages (N) for the oscillator can be determined early on in the design process. Here, if a particularly "fast" oscillation frequency is needed in light of the semiconductor manufacturing process (e.g., if the oscillation frequency $w_{osc}$ begins to push the fundamental limits of the underlying manufacturing technology), the number of delay stages (N) may be kept small so that the round trip delay through the oscillator is consistent with the desired oscillation frequency ($\omega_{osc}$).

Note that it is applications where the underlying manufacturing technology is being pushed to its limits where an oscillator's exposure to common mode oscillation (and/or the reaching of a latched state) has been traditionally most difficult to quantify or understand. As such, note that the present teachings can be readily applied so as to help quantify this exposure and/or intelligently design the oscillator so as to reduce, minimize or eliminate this exposure. With the understanding then that the initial definition 701 of the oscillator's characteristics may include: 1) defining how many stages (N) the oscillator is to have; 2) defining a specific oscillation frequency ($\omega_{osc}$) the oscillator is to have for a specific oscillator supply voltage and swing ($V_{osc}$); and, 3) defining the particular semiconductor manufacturing process that will be used to construct the oscillator; note that, additionally, specific additional functional and/or design characteristics of the oscillator and/or external/environmental restrictions that apply to the oscillator may also be defined during the initial definition sequence 701. These may include: power consumption (P), jitter (J), internal oscillator capacitance ($C_{osc}$); and, external oscillator capacitance ($C_L$).

C.1.a power consumption (P), jitter (J), internal oscillator capacitance ($C_{osc}$): and, external oscillator capacitance ($C_L$)

Two potentially useful additional oscillator characteristics that can be defined without strictly specifying the delay stage inverter drive strengths include power consumption (P) and/or "jitter" (J). Power consumption is the amount of energy consumed per unit time by the oscillator (although it can also be specified as "per delay stage"). Jitter is a measure of the "quality" of the output signal itself. The jitter parameter can be viewed as a parameter that describes how far the oscillator might deviate from $\omega_{osc}$ over time with a fixed supply voltage $V_{osc}$; and, therefore, can be viewed as being akin to a "tolerance" on the $\omega_{osc}$ parameter. More precisely, the jitter parameter captures the statistical uncertainty of the temporal location of an output signal's rising and falling edges. Tradeoffs exist between jitter and power consumption. That is, specifically, improved "jitter" performance (i.e., a smaller jitter number) usually comes at the expense of increased power consumption; and, likewise, reduced power consumption comes at the expense of worsened jitter performance (i.e., a larger jitter number).

Given that different applications may have differing sensitivities to either of these characteristics (e.g., battery powered devices may be more sensitive to power consumption while precision equipment may be more sensitive to jitter), it is anticipated that the ability to mathematically articulate power consumption and jitter for the oscillator will be useful. That is, for example, by using mathematical expressions for power consumption (P) and jitter (J), a designer may be able to visually plot these parameters (so as to visually grasp the applicable tradeoffs); or, an automated software design program may be able to calculate a "desirable" or "optimum" trade-off point. Mathematical expressions for both power consumption and jitter are provided immediately below followed by a qualitative discussion as to the terms observed within each mathematical expression.

The power consumption (P) of an oscillator may be expressed as:

$$P = K_p \frac{N}{N_{\it eff} C_{OSC}} \quad \text{EQN. 1}$$

where: 1) N is the actual number of delay stages (which, as discussed above, can be defined at an early stage in the design process); 2) Neff is the effective number of delay stages which will be discussed in more detail further below; 3) $K_p$ is a proportionality constant that can be determined by those of ordinary skill (e.g., empirically, through simulation with device models that are representative of the underlying manufacturing process, a designer can simulate a number of different oscillators to determine $K_p$ with the assistance of EQN. 1); and, 4) $C_{osc}$ is the "internal" capacitance of the oscillator. A more thorough discussion as to the meaning and relevance of $C_{osc}$ in further simplifying the design process is described in more detail below.

The jitter of an oscillator may be described as:

$$J = K_{PNC} \frac{N^{0.5}}{N_{\it eff}^{1.5}} \frac{C_{OSC}^{-0.5}}{(C_{OSC} + C_L)} \sqrt{\Delta T} \quad \text{EQN. 2}$$

where: 1) again, N is the actual number of delay stages; 2) Neff is the effective number of delay stages which will be discussed in more detail further below; 3) $K_{PNC}$ is a proportionality constant that reflects the noise characteristics of the underlying manufacturing process's devices (and whose meaning is more thoroughly discussed in the last section of this detailed description) as well as the frequency of oscillation and oscillator supply voltage and swing; 4) $\Delta T$ is the time between observations; 5) $C_{osc}$ is the internal capacitance of an oscillator (which, again, is discussed in more detail immediately below); 6) $C_L$ is the "external" capacitance of the oscillator.

Figure 6C:
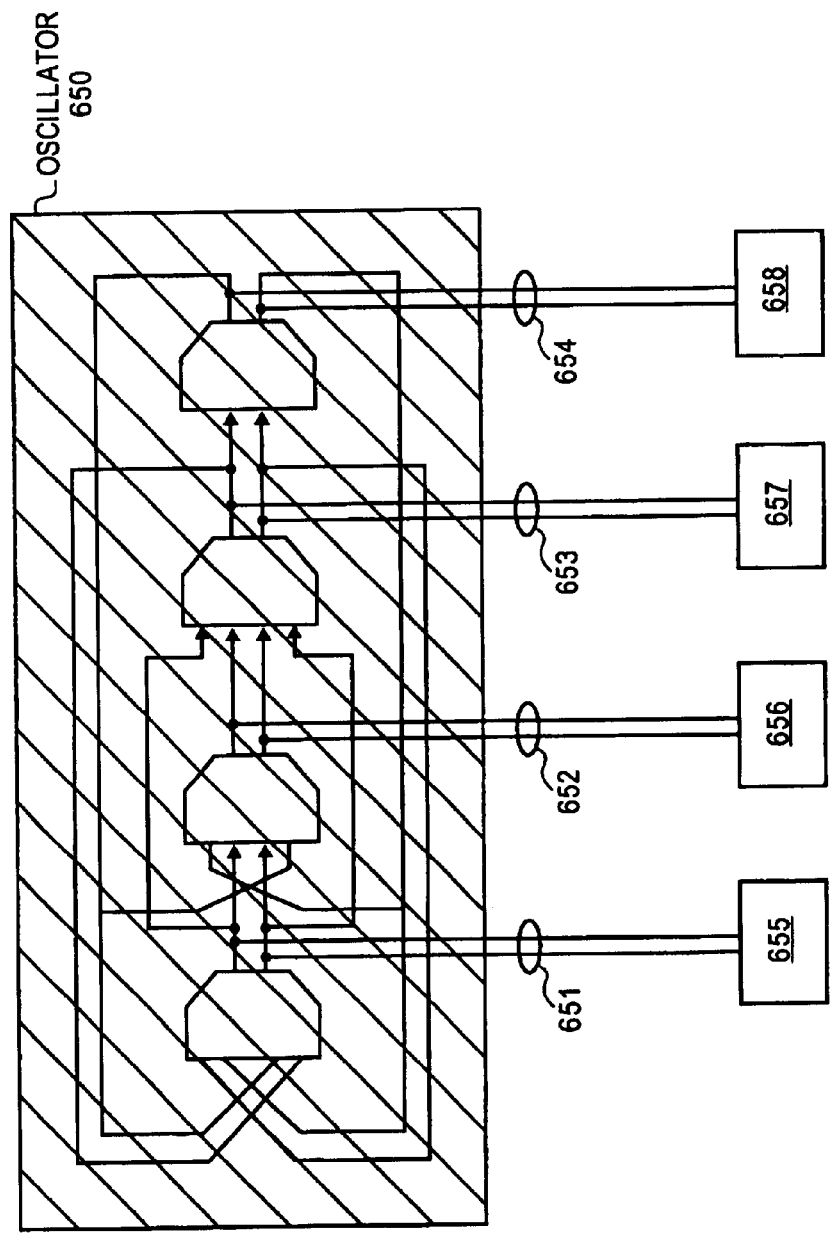
FIG. 6c shows a depiction that relates internal oscillator capacitance to external oscillator capacitance.

$C_{osc}$ relates to the "internal" capacitance of the oscillator while $C_L$ relates to the "external" capacitance of the oscillator. FIG. 6c can be used to demonstrate both capacitances. The "internal" capacitance can be viewed as the capacitance within the oscillator (e.g., the capacitance within the confines of region 650 of FIG. 6c). The "external" capacitance can be viewed as the capacitance that the output node(s) of the oscillator have to drive external to the oscillator (e.g., the capacitance outside the confines of region 650 of FIG. 6c).

Here, it is important to note that an oscillator may have more than one output so that output signals of identical frequency but differing relative phase positions can be provided.

Figure 2A:
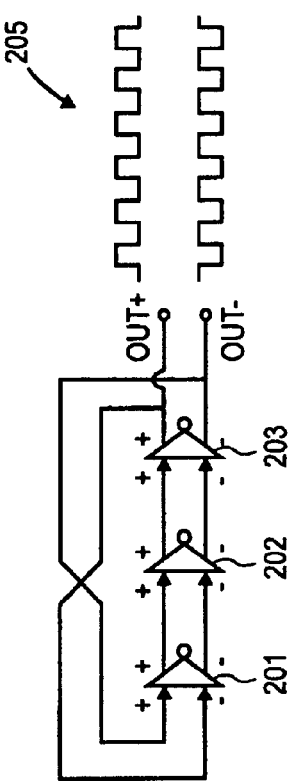
FIG. 2a (prior art) shows a depiction of a differential oscillator circuit.
Figure 2B:
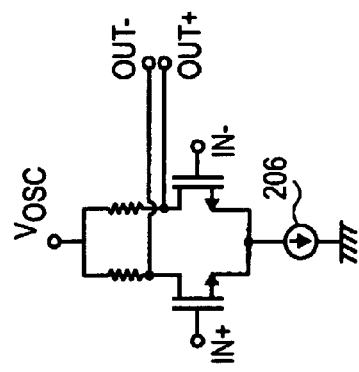
FIG. 2b (prior art) shows a differential inverter circuit.
Figure 4B:
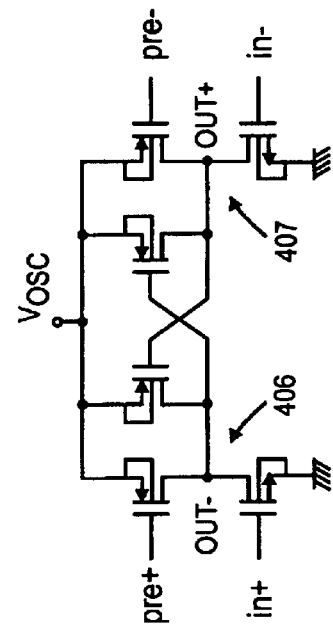
FIGS. 4a and 4b (prior art) shows a depiction of a prior art multi-input delay stage based pseudo-differential oscillator circuit.
Figure 3:
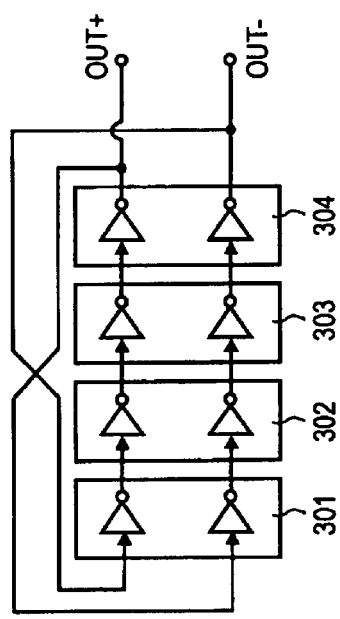
FIG. 3 (prior art) shows a basic pseudo-differential oscillator circuit.
Figure 4A:
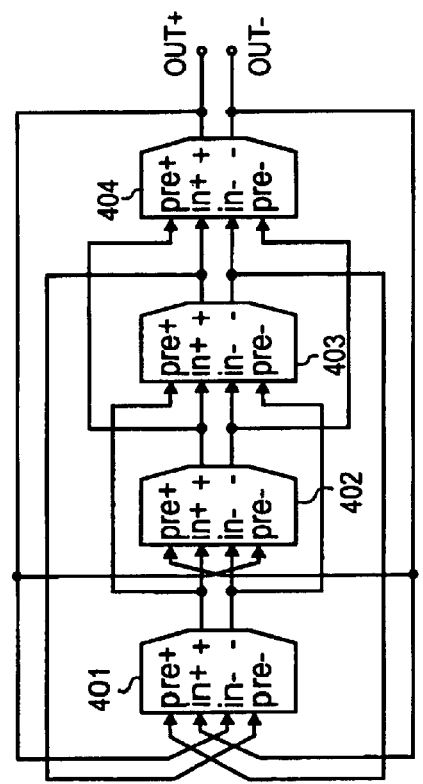

According to one approach, the internal capacitance $C_{osc}$ of the oscillator 650 is the summation of each capacitance within the oscillator 650 divided by 2N (where N is the number of delay stages). Here, if one briefly reviews the delay stage architecture of FIG. 5a, note that the delay stage observed therein includes two nodes (the + output node 520a and the − output node 520b). As such, referring back to FIG. 6c, 2N corresponds to the number of signal nodes within the oscillator 650; and, the summation of each capacitance within the oscillator 650 divided by 2N corresponds to the average capacitance per signal node. Here, the source of the capacitances within the oscillator 650 largely include: 1) the capacitance associated with the transistors from which the inverters within the delay stages are constructed; and, 2) the capacitance of each signal wiring trace that exists within the oscillator (e.g., the capacitance associated with the signal wiring within each delay stage and the capacitance associated with the signal wiring between each delay stage).

By contrast, the external capacitance $C_L$ of the oscillator 650 is the "load" capacitance associated with the circuitry that the output node(s) of the A oscillator are expected to drive. The exemplary depiction of FIG. 6c shows four differential outputs 651 through 654 being used (to provide four signals having four different phase positions) to drive four different receiving circuits 655 through 658. Here, each receiving circuit has an associated capacitance; and, each trace of signal wiring between the oscillator 650 and the different receiving circuits 655 through 658 has an associated capacitance. These capacitances make up components of the oscillator's external capacitance $C_L$. According to one approach (that assumes symmetrical layout of the external circuitry), the external capacitance $C_L$ is the summation of the external trace wiring and load circuitry capacitance divided by 2N (irregardless of the number of outputs provided by the oscillator). As such, an effective "weight" of external capacitance per oscillator signal node can be calculated that is directly comparable with the internal capacitance per signal node provided in the above paragraph.

Here, the external capacitance $C_L$ is a function of the dimensions of the trace wiring, outside the oscillator 650, that is used by the applicable manufacturing process and the type(s) of dielectric material(s) used around the trace wiring by the applicable manufacturing process. As such, the $C_L$ parameter can be viewed as a parameter that is largely descriptive of the underlying manufacturing process rather than the drive strength of the delay stage inverters. As a consequence, strict definition of the $C_L$ parameter early on in the design process does not conflict with the notion that an initial attempt is made to first define the oscillator in terms that do not unduly restrict the relative strengths of the delay stage inverters 701.

By contrast, referring to FIG. 5a, the $C_{osc}$ parameter is a function of the size of the transistors from which the inverters $510_0$–$510_M$ and $510_0$–$510_M$ are constructed. That is, each of the transistors used to form inverters $510_0$–$510_M$ and $511_0$–$511_M$ contribute to a "capacitance" that exists on the differential output nodes (OUT + 520a and OUT − 520b) of the delay stage. A dimension of transistor size that is largely responsible for the aforementioned capacitance contribution for FET manufacturing processes, a dimension that is most often referred to as a transistor's effective gate width, is measured in a direction that is perpendicular to the direction of current flow through the transistor. As the effective gate width of a transistor also largely determines a transistor's drive strength—strict definition of the $C_{osc}$ parameter, unfortunately, would lead toward the strict definition of the inverter drive strength. As a consequence, unlike the $C_L$ parameter, strict definition of the $C_{osc}$ parameter early on in the design process offends the notion that an initial attempt is made to first define the oscillator in terms that do not unduly restrict the relative strengths of the delay stage inverters 701. A similar statement can be made for transistor technologies other than FETs (e.g., bipolar).

As such, the removal of the $C_{osc}$ term from both of EQNs 1 and 2 is desirable. An expression that can be used to serve this purpose is provided below in EQN. 3.

That is:

$$\frac{C_{OSC}}{C_L} = \frac{1}{\frac{\omega_C}{N_{eff}\omega_{OSC}} - 1}. \qquad \text{EQN. 3}$$

where: 1) Neff is the effective number of delay stages which is described in more detail below; 2) $\omega_{osc}$ is the oscillation frequency of the oscillator (which, as discussed above, can be defined early in the design process); and, 3) $\omega_c$ is the "intrinsic speed" of the delay stage (i.e., the speed of a delay stage when loads external to the oscillator are ignored (i.e., when $C_L=0$). The $\omega_c$ parameter (which can be viewed as being closely related to an "ideal" propagation delay $P_D$ of the delay stage), in an embodiment, can be further defined as $2\pi/(t_{r/f})$ where $t_{r/f}$ is the summation of the rise time and the fall time of a delay stage inverter (where rise time is assumed to be equal to fall time) when followed and preceded by identically sized inverters. For FET base processes, the intrinsic speed $\omega_c$ of a delay stage is largely a function of the minimum effective gate length (as opposed to effective gate width which was described above with respect to the $C_{osc}$ parameter) of the transistors that are used to form the inverters $510_0$–$510_M$ and $511_0$–$511_M$ of the delay stage. As a transistor's effective gate length is typically determined by the minimum dimension obtainable from the underlying manufacturing process's lithography, specification of the $\omega_c$ parameter does not offend an initial attempt to first define the oscillator in terms that do not unduly restrict the relative strengths of the delay stage inverters.

EQN. 3 articulates a general relationship between: 1) the relative sizes of a delay stage's internal and external capacitances (as represented by the $C_{osc}/C_L$ term); and, 2) the "intrinsic speed" of a delay stage relative to the performance of the oscillator (i.e., as represented by the $\omega_c/\omega_{osc}$ term). For example, EQN. 3 indicates that as the "intrinsic speed" of a delay stage becomes much greater than the speed of the oscillator (i.e., $(\omega_c/\omega_{osc})>>1$), the external capacitance should be much greater than the internal capacitance (i.e., $(C_{osc}/C_L)<<1$). This essentially describes an "easy" oscillator design where the underlying manufacturing process can easily reach the speeds required by the oscillator. As such, the external capacitance $C_L$ may be "increased" to some extent in order to "slow down" the operational speed of the oscillator as appropriate.

By contrast EQN. 3 also indicates that as the performance of the oscillator begins to approach the "intrinsic speed" of a delay stage (i.e., $\omega_c/\omega_{osc}$ begins to approach a value of 1.0), the possibility of simply being able to design the oscillator becomes threatened (i.e., because Cosc /$C_L$ may become negative which is not physically realizable). This essentially describes a "difficult" oscillator design because the speed of the oscillator is pushing the fundamental limits of the underlying manufacturing process. For those "difficult" oscillator designs that are barely workable (i.e., ($\omega_c$/Neff($\omega_{osc}$) is barely greater than 1.0), note that the internal capacitance becomes much greater than external capacitance (i.e., (Cosc/$C_L$)>>1). This effectively means that in order to successfully design an oscillator that pushes the limits of its underlying manufacturing process—the external capacitance $C_L$ should be minimized. With respect to EQN. 3, the Neff parameter helps to describe the ability to quicken the speed of operation by introducing more inputs (i.e., increasing M) to each delay stage. Again, the Neff parameter is described in more detail below.

Substitution of EQN.3 into both EQN.s 1 and 2, yields EQN.s 4 and 5 below for power (P) and jitter (J), respectively:

$$P = K_p \frac{C_L N}{\frac{\omega_C}{\omega_{OSC}} - N_{eff}} \qquad \text{EQN. 4}$$

$$J = K_{PNC} \frac{\omega_{OSC}}{\omega_C} \sqrt{\frac{1}{C_L} \frac{N}{N_{eff}} \left(\frac{\omega_C}{N_{eff}\omega_{OSC}} - 1\right)} \Delta T \qquad \text{EQN. 5}$$

Here, note that the substitution of EQN. 3 into EQN.s 1 and 2 results in the jitter (J) and power (P) parameters being described in terms, including the Neff term, that do not unduly restrict the drive strengths of the delay stage inverters. A discussion of the Neff term is provided immediately below.

C. 1.b the effective number of delay stages (Neff)

The effective number of delay stages, Neff, is a convenient way to articulate the effects of the relative inverter design strengths on the oscillator's functional operation (e.g., through jitter (J) and power consumption (P)) without actually defining specific values for the inverter drive strengths themselves. As such, the desired flexibility in the range of permissible inverter drive strengths can still be maintained during the early stages of the design process; while, at the same time, specific values can be assigned to both jitter (J) and power consumption (P) (even though these parameters are, in fact, impacted by the inverter drive strengths). Better said, given that inverter driver strengths have an "effect" on jitter and power consumption; and, recognizing that actually defining the inverter drive strengths relative to one another is a decision 702 that is left to later in the design methodology, the effective number of delay stages Neff is a convenient parameter that allows one to represent the effect that the inverter driver strengths will have upon jitter J and power consumption P without, as yet, limiting the design to a specific set of inverter drive strengths relative to another. In a sense, Neff begins to define a range that "workable" combinations of inverter drive strengths may fall within—without defining a precise combination of drive strengths that fall within that range.

More insight into the "meaning" of the effective number of delay stages Neff is discussed further below with respect to FIGS. 10a through 10c. Before providing this discussion, however, a discussion of an embodiment for determining Neff will first be described with respect to FIGS. 8 and 9a, 9b. Here, importantly, note that being able to define Neff allows the design process to strictly define the jitter and power consumption characteristics that the oscillator is to have. That is, referring back to EQNs. 4 and 5, being able to "plug in" numbers into each of the terms represented in these equations will produce a specific value for jitter and power consumption, respectively. As such, FIGS. 8 and 9a,b relate to a methodology for selecting a specific Neff value.

Figure 8:
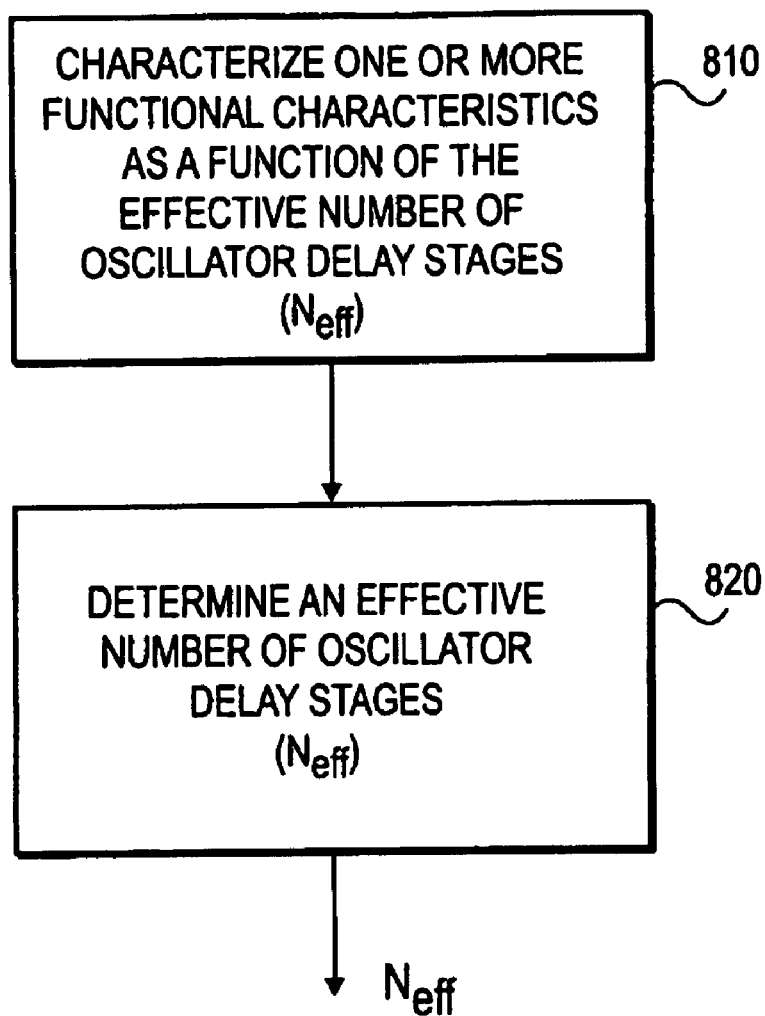
FIG. 8 shows a embodiment of a methodology that may be used to help determine and/or define an oscillators constraints.

FIG. 8 shows a methodology for defining the effective number of delay stages Neff. Note that the methodology of FIG. 8 may be viewed as a component of the overall initial oscillator characteristic definition process 701 observed in FIG. 7. According to the methodology of FIG. 8, one or more oscillator functional characteristics (e.g., jitter (J) and power consumption (P)) are characterized 810 as a function of the effective number of oscillator delay stages (Neff); then, an effective number of oscillator delay stages Neff is determined 820. FIGS. 9a and 9b illustrate an example in more detail. According to the methodology of FIG. 9a, the oscillator's jitter (J) and power consumption (P) are characterized 910 as a function of Neff. In a further embodiment, this simply involves "plugging" the appropriate quantities into EQN.s 4 and 5 above except for the Neff term (which is left as a variable). An effective number of delay stages Neff is then determined through graphical or numerical analysis.

FIG. 9b helps illustrate a graphical analysis. FIG. 9b shows an exemplary graphical depiction of the jitter (J) 920 plotted vs. Neff and an exemplary graphical depiction of the power consumption (P) 930 plotted vs. Neff. Note that the jitter and power curves 920, 930 may be presented to a designer (e.g., though a graphical user interface (GUI)). Again, curves 920 and 930 can be viewed as an exemplary depiction of EQNs. 4 and 5 being respectively plotted as a function of Neff (e.g., with all other terms being specified). As such, each unique value of Neff may correspond to a unique jitter J and power consumption P value pair for the oscillator being designed. As such, the designer (or automated design process) can select a particular "designed for" operating point for the oscillator (with respect to power consumption and jitter) by choosing a specific Neff value. Should a particular jitter value J and power consumption value P pair be deemed agreeable (e.g., the jitter value positioned at 921 and the power consumption positioned at 922), the oscillator design may be effectively constrained to these values by selecting a specific effective number of delay stages Neff (e.g., Neff value 940).

If an agreeable jitter value and power consumption pair cannot be found, the designer is free to change the external capacitance so that a different pair of curves (representing a different tradeoff situation) can be analyzed. That is, noting that the exemplary curves of FIG. 9b (in one embodiment) may be viewed as the plotting of EQNs. 4 and 5 with a specific $C_L$ value, changing the $C_L$ value should change the shape and/or positioning of the curves themselves. In a common situation, a more favorable tradeoff (e.g., where less jitter can be achieved with less power consumption) may be realized by reducing the external capacitance (e.g., by shortening the external trace wiring, reducing the capacitance of the external load circuitry, and/or eliminating use of an output altogether). If alteration of $C_L$ does not provide a workable solution, the oscillator architecture may need to be reconfigured (e.g., by changing N) and/or a different manufacturing process may need to be considered.

It is important to recognize that although the discussion above has referred to an analysis of the oscillator's jitter characteristics, another parameter that is related to jitter, a parameter that is often referred to as "phase noise", may be focused upon as well or in the alternative. Whereas jitter characterizes the uncertainty of an oscillator's oscillation frequency over time in the time domain, phase noise characterizes the uncertainty of an oscillator's oscillation frequency over time in the frequency domain. Phase noise analysis is touched upon in more detail in the last section of this detailed description.

FIGS. 10a through 10c help to provide insight into the meaning of Neff. An oscillator can be deemed to possess an "effective" number of delay stages as a consequence of there being different oscillation path lengths superimposed within the oscillator; where, each unique oscillation path length spans across a different number of delay stages. As such, the oscillator can be viewed as a cooperative collection of different oscillator circuits. The effective number of delay stages corresponds to a weighted average that takes into account the relative strength of each of the different oscillation path lengths that apply to the oscillator. For example, FIG. 10a shows an N=6, M=2 oscillator which is an oscillator topology that lends itself easily to understanding the Neff concept. An N=6, M=2 oscillator has two different oscillation path lengths. A first oscillation path length, referred to in FIG. 10b, is a six stage path length and corresponds to the closed loop path that flows through each delay stage's primary input. A second oscillation path length, referred to in FIG. 10c, is a three stage path length and corresponds to those closed loop paths that flow through the delay stages' secondary inputs. Note that two such paths exist (a first that strings delay stages $1001_1$, $1001_3$ and $1001_5$ together and a second that strings delay stages $1001_2$, $1001_4$ and $1001_6$ together).

The effective number of delay stages is related to the relative drive strengths of the delay stage inverters. That is, for example, if the drive strength of the inverters that receive the delay stages' secondary inputs are significantly stronger than the drive strength of the inverters that receive the delay stages' primary inputs, an N=6, M=2 oscillator is apt to have a Neff that is closer to 3.0 because the three stage path length (as observed in FIG. 10c) will be more "dominant" than the six stage path length (that is observed in FIG. 10b). Likewise, if the drive strength of the inverters that receive the delay stages' primary inputs are significantly stronger than the drive strength of the inverters that receive the delay stages' secondary inputs, an N=6, M=2 oscillator is apt to have a Neff that is closer to 6.0 because the six stage path length (as observed in FIG. 10b) will be more "dominant" than the three stage path length (that is observed in FIG. 10c).

As such, defining the effective number of delay stages Neff corresponds to "an advance" toward specifying the drive strengths of the inverters within the delay stages. Thus, referring briefly back to FIG. 7, after an Neff value has been defined, the design methodology may proceed toward defining the inverter drive strengths as scaled versions of one another 702.

C.2 Defining the Inverter Drive Strengths As Scaled Versions of One Another (differential mode analysis and common mode analysis)

FIG. 11 shows a methodology for defining the inverter drive strengths as scaled versions of one another. According to the methodology of FIG. 11, permissible combinations of inverter drive strengths are articulated 1101 as scaled versions of one another. Referring briefly back to the delay stage embodiment of FIG. 5b, note that: 1) the drive strength of the cross-coupling inverters $510_0$, $511_0$ may be expressed as $k_0$; 2) the drive strength of the primary input inverters $510_1$, $511_1$ may be expressed as $k_1$; 3) the drive strength of the secondary input inverters $510_2$, $511_2$ may be expressed as $k_2$;, etc. Here, a plurality of mathematical expressions may be used to, as a whole, articulate the permissible k value combinations. Better said, a family of mathematical expressions may be used to both: 1) articulate that the inverter drive strengths are to be implemented as scaled versions of one another; and, 2) introduce constraints to the range of permissible k value combinations that are imposed as a consequence of the previous definition of oscillator characteristics (e.g., that were defined during design stage 701 of FIG. 7).

A first mathematical expression may be used to articulate that the inverter drive strengths are to be implemented as scaled versions of one another. An embodiment of such an expression is provided below as EQN. 6.

$$\sum_{i=0}^{i=(N-1)} k_i = 1 \quad \text{EQN. 6}$$

EQN. 6 effectively normalizes the total drive strengths from all the inverters equal to 1.0; which, in turn, corresponds to expressing the inverter drive strengths in terms of their corresponding percentage of the total drive strength from all inverters. Note that any equation that can be reduced to EQN. 6 likewise expresses the inverter drive strengths as scaled versions of one another. Moreover, other relationships that relate the summation of drive strengths to a constant other than 1.0 are also possible.

A second mathematical expression may be used to articulate constraints that have already been imposed as a consequence of the previous definition of oscillator characteristics (e.g., that were defined during design stage 701 of FIG. 7). Here, following from the discussion of the previous section, note that a number of oscillator characteristics might be defined without restricting the inverter drive strengths (e.g., N, semiconductor manufacturing process, and oscillation frequency $\omega_{osc}$). Such characteristics are therefore not expected to play a role in defining a permissible range of inverter drive strengths. By contrast, those oscillator characteristics that are related to the drive strengths of the inverters (e.g., jitter and power consumption) are expected to contribute to the definition of a permissible range of inverter drive strength values. Here, the Neff parameter is used for this purpose through EQN. 7 as expressed below.

$$\frac{1}{N_{eff}} = \sum_{i=0}^{i=(N-1)} k_i \frac{i}{N} \quad \text{EQN. 7}$$

Specifically, note that EQN. 7 relates the effective number of delay stages, Neff, to the drive strengths of the inverters themselves.

According to EQN.s 6 and 7 for "i" values greater than 1, "i" denotes the priority of the delay stage input. The i=0 value corresponds to the cross-coupling inverters 510₀, 511₀ (referring briefly to FIG. 5a). Note that corresponding inverter pairs should be designed to have the same inverter drive strength; and, as such, either or both of their drive strengths may be represented by a single k value (e.g., the drive strength of either or both of inverters 510₀, 511₀ can be represented by k₀; the drive strength of either or both of inverters 510₁, 511₁ can be represented by k₁; etc.). Note also that, with respect to EQN. 7, the cross-coupling inverters 510₀, 511₀ have no effect because, for them, i=0 which always produces a 0.0 term in EQN. 7.

Moreover, note that EQN. 7 can be sanity checked against the example that was provided just above with respect to FIGS. 10a through 10c. That is, if the six stage oscillation path is to "dominate", then: k₀≈0; k₁≈1.0; and, k₂≈0. Plugging these values into EQN. 7 along with a value of N=6 produces 1/Neff=((0)(0)/6) +((1)(1)/6)+((0)(2)/6)=1/6; which, in turn, corresponds to Neff=6. Similarly, if the three stage oscillation path is to "dominate" then: k₀≈0; k₁≈0; and, k₂≈1.0. Plugging these values into EQN. 7 along with a value of N=6 produces 1/Neff=((0)(0)/6)+((0)(0)/6)+((1)(2)/6)=2/6=1/3; which, in turn corresponds to Neff=3. Note that a k value of 0 simply means that its corresponding inverter is effectively non existent within the delay stage (e.g., is not designed into the delay stage).

Note also that the k values for a particular design can often be expressed as rational fractions having a common denominator. For example, if the primary and secondary inverter drive strengths k₁, k₂ in the N=6, M=2 oscillator of FIGS. 10a through 10c are to be designed equally strong (and if the cross coupling inverters 510₀, 510₁ are not used), then k₁=k₂=1/2. Note that this corresponds to 1/Neff=((0)(0)/6)+((0.5)(1)/6)+((0.5)(2)/6)=3/12=1/4. Consistent with this description, an N=6, M=2 oscillator having primary and secondary inverter drive strengths that are equal to one another will tend to behave "between" that of an Neff=3 oscillator and that of an Neff=6 oscillator (e.g., by exhibiting higher oscillation frequency that an Neff=6 oscillator and lower jitter than an Neff=3 oscillator). It has been observed that striving to define the k values in terms that can be reduced to rational fractions having a common denominator results in robust oscillator design.

To review then, EQN.s 6 and 7 together correspond to an embodiment of an articulation 1101 of permissible combinations of inverter drive strengths as scaled versions of one another. That is, any combination of k values that satisfies both EQN 6 and EQN 7 may be viewed as a combination of inverter drive strengths that may be entertained for the oscillator to be designed. Once a family of possible k value combinations has been articulated 1101a; then, subsequently, a specific combination of k values from the family of possible k values is selected 1102.

It is important to note, referring to EQN.s 6 and 7 (as well as FIG. 5a), that the number of differential inputs per delay stage (M) may still be viewed as a variable. That is, referring to FIG. 7, if the designer so chooses, defining the number of differential inputs per delay stage (M) may be regarded as part of the definition 702 of the delay stage inverter drive strengths as scaled versions of each other (the logic being that defining the number of inverters per delay stage is part of the process of defining their drive strengths relative to one another). Here, note that the number of differential inputs per delay stage can be defined simply by assigning a zero value or a non-zero value to the various k values.

That is, for example, if a designer chooses $k_i$ to be non-zero for i=1,2 and 3 and chooses $k_i$=0 for i≧4; then, by definition, the designer has chosen each delay stage to entertain three differential inputs (i.e., M=3). By contrast, if a designer chooses $k_i$ to be non-zero for i=1 and 2 and chooses $k_i$=0 for i≧3; then, by definition, the designer has chosen each delay stage to entertain two differential inputs (i.e., M=2). Here, note that in some circumstances a specific Neff value might be more easily reached by adding more non zero k values. As this corresponds to adding more inputs per delay stage, note that the overall effect is to guide the designer or design process toward the addition of more inputs per delay stage (e.g., as may be reasonable if the speed of the underlying manufacturing process is being pushed toward its limits).

Additionally, whether or not cross-coupling inverters 510₀, 511₀ are to be implemented is also a decision that may be left open to the designer as part of the later definition stage 702. Here, similar to the discussion just above, whether or not cross coupling inverters are to be employed corresponds to a decision as to whether k₀ is zero or non-zero. If k₀ is chosen to be zero; then, cross coupling inverters are not used. If k₀ is chosen to be non-zero; then, cross coupling inverters are used.

Consistent with this perspective, referring to FIG. 11, the articulated combinations 1101 of permissible drive strengths as scaled versions of one other (e.g., as observed in EQN.s 6 and 7) not only include representations of the inverter drive strengths (via specific numeric values for each of the k values) but also reflect the number of differential inputs per delay stage that may be employed (which can be restated as defining which $k_i$ values are zero vs. non-zero for $i \geq 1$); and, whether or not cross coupling inverters are to be used (which can be restated as whether or not $k_0$ is to be non-zero or zero). As such, according to at least one embodiment, providing definition to each of these variable concepts may be viewed as the defining 1102 of a specific combination of k values from the initial set of articulated, permissible combinations 1101.

FIG. 12 illustrates an embodiment of a methodology that may be used to determine any or all of these variable issues for a particular design application. As alluded to at various instances above, the oscillator's tendency to embrace differential mode oscillation and to "stay away from" common mode oscillation can be used as guidance for selecting a particular combination of k values. Better said, as different k value combinations might yield different oscillator designs having different tendencies toward or away from differential oscillation and common mode oscillation, selecting a particular k value combination whose corresponding oscillator exhibits a strong tendency to remain in differential mode oscillation and to stay away from common mode oscillation should be a useful strategy for many applications.

Such a strategy therefore might entail analyzing 1201 both differential mode gain and common gain for various k value combinations; and, selecting a particular combination that is acceptable for the application 1201 (e.g., the k value combination that results in the combined strongest differential mode gain and weakest common mode gain). For any oscillator, the following equations describe (as a function of its specific k values and N), respectively, the minimum small signal common mode gain needed by the oscillator to have any propensity toward common mode oscillation (expressed in EQNs 8a and 8b); and, the minimum small signal differential mode gain needed by the oscillator to have any propensity toward differential mode oscillation (expressed in EQNs 9).

$$A_{cm} = \frac{1}{\sum_{i=0}^{i=(N-1)} k_i \cos\left(\pi - 2\pi \frac{i}{N}\right)} \quad \text{(for even } N\text{)} \quad \text{EQN. 8a}$$

$$A_{cm} = \frac{1}{\sum_{i=0}^{i=(N-1)} (-1)^{(i+1)} k_i \cos\left(\pi \frac{i}{N}\right)} \quad \text{(for odd } N\text{)} \quad \text{EQN. 8b}$$

$$A_{diff} = \frac{1}{\sum_{i=0}^{i=(N-1)} k_i \cos\left(\pi \frac{i}{N}\right)} \quad \text{EQN. 9}$$

Here, as recognized by those of ordinary skill, an oscillator's small signal common mode gain is the amplification that the oscillator provides to a small common mode signal; and, likewise, an oscillator's small signal differential mode gain is the amplification that the oscillator provides to small differential mode signal. A common mode signal is a signal having identical features when the + and − ends of a differential channel are compared; and, a differential mode signal is a signal having opposite features when the + and − ends of a differential channel are compared.

Thus, in order for an oscillator to have any propensity toward common mode oscillation, the oscillator must have a common mode gain beyond that specified by either EQN. 8a or 8b (depending on whether N is even or odd). Moreover, an oscillator's propensity toward a particular mode of oscillation is a function of the extent to which the oscillator's actual, respective gain is beyond that expressed by EQNs. 8a or 8b; and EQN 9. Thus, for example, an oscillator whose actual differential mode gain is orders of magnitude beyond that specified by EQN. 9 will have a much stronger propensity toward a differential mode of oscillation than an oscillator whose actual differential mode gain is slightly higher than that specified by EQN. 9.

As any oscillator is bound to have some differential mode gain and some common mode gain, in light of the comments provided just above, it is therefore a useful strategy to select a combination of k values that produce a large minimum common mode gain needed for common mode oscillation (according to either EQN. 8a or 8b); and, a small minimum differential mode gain needed for differential mode oscillation (according to EQN. 9). More generally, a combination of k vales should be selected that results in the outcome of EQN. 9 being less than the outcome of EQN. 8a or 8b. Here, again given that any oscillator is apt to have some common mode gain and some differential mode gain, the larger the minimum gain needed for common mode oscillation and the smaller the minimum gain needed for differential mode oscillation, the stronger the oscillator's tendency to embrace differential mode oscillation and to reject common mode oscillation.

As an example, consider an N=6, M=2 oscillator (e.g., as observed in FIGS. 10a through 10b) where $k_1=k_2=0.5$ (and all other k values are 0.0). Incorporation of these terms into EQN. 8a (because N is even) yields a minimum common mode gain needed for the oscillator to exhibit a common mode of oscillation of $1/0=\infty$; and, incorporation of these same terms into EQN. 9 yields a minimum differential mode gain needed for the oscillator to exhibit a differential mode of oscillation of $4/((3)^{0.5}+1) \approx 1.46$. Here, because the minimum common mode gain needed for common mode oscillation is infinite—it is impossible for the oscillator to exhibit common mode oscillation (because the oscillator must have a finite common mode gain; which, in turn, means that the minimum gain needed for common mode oscillation can not be reached).

Moreover, because the minimum differential mode gain needed for differential mode oscillation is a small number (1.4)—the oscillator should be able to easily exhibit a differential mode of oscillation (because the oscillator is apt to have a differential mode gain well beyond 1.4). As such, an N=6, M=2 oscillator where $k_1=k_2=0.5$ (and all other k values are 0.0) is expected to exhibit a strong propensity toward a differential mode of oscillation without there being a risk of the oscillator exhibiting a common mode of oscillation. As a second example, an N=4, $k_0=1/6$; $k_1=2/3$; $k_2=1/6$ oscillator should have a similarly strong propensity toward differential mode oscillation because incorporation of these terms into EQN. 8a yields a minimum common mode gain needed for the oscillator to exhibit a common mode of oscillation of $1/0=\infty$; and, incorporation of these same terms into EQN. 9 yields a minimum differential mode gain needed for the oscillator to exhibit a differential mode of oscillation of $3/((2)^{0.5}+0.5) \approx 1.57$.

Over the course of designing various oscillators, some additional relevant design perspectives regarding the use of the cross-coupling inverters 510$_0$ and 511$_0$ have also emerged. These include, firstly, that for many currently practical implementations where N is even, the cross coupling inverters help the oscillator avoid a latched state (which may be alternatively viewed as recognizing that the cross-coupling inverters help induce oscillation within the oscillator). Recall that the latched state was first discussed in the background. As such, the stronger the relative strength of the cross-coupling inverters, the stronger the oscillator's rejection of a latched state. More specifically, it has been discovered that for cases where N is even the latched state can be avoided so long as:

$$k_0 > \frac{1}{N} \sum_{i=1}^{i=(N-1)} (-1)^{(i+1)} k_i \text{ with } k_1 > 0.$$  EQN. 10a In practice, the constraint in EQN 10a. usually reduces to:

$$k_0 > \frac{1}{N}(k_1 - k_2),$$  EQN. 10b or to:

$$k_0 > \frac{1}{N}(k_1 - k_2 + k_3).$$  EQN. 10c

Secondly, for many currently practical implementations where N is odd, the cross coupling inverters help the oscillator avoid common mode oscillation (e.g., the stronger the relative strength of the cross coupling inverters, the higher the common mode gain of EQN. 8b). For odd N, a latched state is not possible because of the logical inversion performed by each delay stage.

Recalling from the background that increasing the number of inputs to a delay stage of a pseudo-differential oscillator can increase its oscillation frequency, note that—to first order—EQN. 7 seems not to reflect this property because: 1) neither the intrinsic speed of a delay stage $\omega_c$ nor the oscillation frequency $\omega_{osc}$ of the oscillator appear in EQN. 7; and, 2) Neff is a function of non zero k values for i greater than 1. For present day CMOS manufacturing technologies (e.g., at least 0.13 um and 0.18 um processes), so long as Neff≧3.8, the impact of adding additional inputs to the delay stage (e.g., the effect of considering non zero k values for higher and higher values of i) to oscillator speed are minimal. As such, EQN. 7 is largely accurate for designs where Neff≧3.8 at least with respect to present day CMOS manufacturing technologies. For Neff<3.8, a different equation, provided immediately below should be used.

$$\frac{1}{N_{eff}} = \left( \sum_{i=0}^{i=(N-1)} k_i \frac{i}{N} \right) \left\{ 1 + \frac{c_{N_{eff}}}{e} \left[ \frac{\tan\left(\pi \sum_{i=0}^{i=(N-1)} k_i \frac{i}{N}\right)}{\pi} - \left(\sum_{i=0}^{i=(N-1)} k_i \frac{i}{N}\right) \right] \right\}$$  EQN. 11

Here, EQN. 11 effectively provides a correction factor applicable at least to present day CMOS manufacturing technologies that accounts for the increase in speed (e.g., as related through EQN.s 4 and 5) to an oscillator as non zero k values for higher and higher values of i are considered. Note that $C_{N_{eff}}$ is a constant usually around 1.0 for present day CMOS manufacturing technologies.

D. Application Notes

D.1 General

It is important to recognize that each of EQNs. 1 through 11 above are applicable to manufacturing technologies other than standard CMOS (such as FET based technologies generally as well as bipolar technologies). Moreover, those of ordinary skill will be able to determine an appropriate range of Neff over which an appropriate correction factor is to be applied to EQN. 10 (as well as the correction factor itself) for processing technologies other than present day CMOS.

FIGS. 13a and 13b relate to a common application of oscillator circuits: voltage controlled oscillators for use in a phase locked loop circuit. FIG. 13a shows an architecture for a voltage controlled oscillator; and, FIG. 13b shows an architecture for a phase lock loop circuit having a voltage controlled oscillator. According to the architecture of FIG. 13a, a voltage controlled oscillator 1301 may be constructed by coupling the output of a voltage to current converter 1302 to the supply node 1304 of the oscillator 1303. Here, oscillator 1303 may be any oscillator having a delay stage as taught herein. Note that the supply node 1304 of the oscillator 1303 may correspond to the supply node of the inverters used to construct the oscillator's delay stage(s) (e.g., the $V_{osc}$ terminal observed in FIG. 1b).

The oscillator 1301 of FIG. 13a typically possess a linear relationship between the voltage applied at its input node 1305 and the frequency of the oscillator 1303 output signal. Here, the voltage to current converter 1302 applies supply current to the oscillator 1303 (to which a $V_{osc}$ voltage at node 1304 responds) which affects the propagation delay of the oscillators constituent delay stages. FIG. 13b shows an exemplary depiction of a Phase-Lock-Loop (PLL) circuit. The PLL includes a voltage controller oscillator 1301, a feedback divider 1306, a phase comparator 1307, a charge pump. 1308 and a loop filter 1309. The theory of operation of a PLL circuit may be found within a wealth of different published papers and standard textbooks.

It is also important to recognize that the various design methodologies discussed above may be at least partially implemented as software routines (e.g., in a computer-aided-design tool product that assists designers in the design of their oscillators, voltage controlled oscillators, and/or phase-lock-loop circuits). As such, the various methodologies discussed above may be at least implemented with machine readable one or more machine readable media. Moreover, the various circuit designs that have been referred to above may be represented within one or more machine readable media (e.g., as a netlist file or other circuit description data format.

Note also that embodiments of the present description may be implemented not only within a semiconductor chip but also within machine readable media. For example, the designs discussed above may be stored upon and/or embedded within machine readable media associated with a design tool used for designing semiconductor devices. Examples include a circuit description formatted in the VHSIC Hardware Description Language (VHDL) language, Verilog language or SPICE language. Some circuit description examples include: a behaviorial level description, a register transfer level (RTL) description, a gate level netlist and a transistor level netlist. Machine readable media may also include media having layout information such as a GDS-II file. Furthermore, netlist files or other machine readable media for semiconductor chip design may be used in a simulation environment to perform the methods of the teachings described above.

Thus, it is also to be understood that embodiments of this invention may be used as or to support a software program executed upon some form of processing core (such as the Central Processing Unit (CPU) of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; magnetic tape storage media; optical storage media; flash memory devices; electrical, optical, acoustical or other form of propagated signals (e.g., carrier waves, infrared signals, digital signals, etc.); etc.

FIG. 14 is a block diagram of a computing system 1400 that can execute instructions residing on a machine readable medium. The instructions may be related to automatic synthesis and/or design of an integrated circuit (e.g., as described above). In one embodiment, the machine readable medium may be a fixed medium such as a hard disk drive 1402. In another embodiment, the machine readable medium may be movable such as a CD ROM 1403, a compact disc, a magnetic tape, etc. The instructions (or portions thereof) that are stored on the machine readable medium are loaded into Random Access Memory (RAM) 1405; and, the processing core 1406 then executes the instructions. The processing core may include one or more processors (including microprocessors). Note also that different computing system implementations from those referred to by FIG. 1 are possible (e.g., such as a collection of computing systems that share their processing power as a cooperative whole in order to perform a larger software routine).

D.2 The $K_{PNC}$ proportionality constant

The $K_{PNC}$ proportionality constant used in the jitter expressions of EQN. 2 and EQN. 5 can be expressed in terms of process parameters and device noise properties.

The following discussion on $K_{PNC}$, jitter, and the relationship between jitter and phase noise is based on the application of the impulse sensitivity function (ISF) as defined in the following journal articles:

A. Hajimiri and T. H. Lee, "A general theory of phase noise in electrical oscillators," *IEEE Journal of Solid-State Circuits*, vol. 33, no. 2, pp. 179–194, February, 1998.

A. Hajimiri, S. Limotyrakis, and T. H. Lee, "Jitter and phase noise in ring oscillators," *IEEE Journal of Solid-State Circuits*, vol. 34, no. 6, pp. 790–804, June, 1999.

While the time difference between zero crossings is constant in an ideal oscillator, it becomes a variable in the presence of noise sources. The uncertainty between the zero crossings is known as jitter. Jitter increases as the time between the zero crossings increases. The statistics of jitter is usually expressed in terms of the standard deviation of the timing uncertainty.

The standard deviation of jitter ($\sigma_{\Delta T}$) due to independent (uncorrelated) noise sources is proportional to the square root of the time between observations, $\Delta T$:

$$\sigma_{\Delta T} = \kappa \sqrt{\Delta T}; \qquad \text{EQN. 12,}$$

where $\kappa$ is a constant of proportionality.

The standard deviation of jitter ($\sigma_{\Delta T}$) due to correlated noise sources (including noise at frequencies much smaller than the oscillation frequency) is proportional to the time between observations, $\Delta T$:

$$\sigma_{\Delta T} = \zeta \Delta T \qquad \text{EQN. 13,}$$

where $\zeta$ is a constant of proportionality.

While, the expression involving $\kappa$ dominates for small values of $\Delta T$, the expression involving $\zeta$ may become important for larger values of $\Delta T$. However, as discussed in the references, the effect of correlated noise sources can be minimized by ensuring that the impulse sensitivity function (ISF) is symmetric with respect to the rising and falling edges so that the average value of the ISF is zero (a condition that, to first order, translates to sizing the pull-up and pull-down devices to have equal rise and fall times). Therefore, for all practical values of $\Delta T$ interest, only the expression involving needs to be $\kappa$ considered. This proportionality constant can be expressed as:

$$\kappa = \frac{\Gamma_{rms}}{q_{max}\omega_{OSC}}\sqrt{N\frac{\overline{i_n^2}}{\Delta f}} \qquad \text{EQN. 14}$$

where $\Gamma_{rms}$ is the root mean square value of the ISF, $q_{max}$ is the maximum charge at one node during one transition, $\omega_{osc}$ is the radial oscillation frequency, N is the number of stages and $$\frac{\overline{i_n^2}}{\Delta f}$$

is the total current noise power spectral density per oscillating node. The above parameters can be calculated as a function of $C_{osc}$, $C_L$, and $\omega_c$.

With the understanding then that the initial definition of an oscillator's characteristics may include: 1) defining how many stages (N) the oscillator is to have; 2) defining a specific radial oscillation frequency ($\omega_{osc}$) the oscillator is to have for a specific oscillator supply voltage and voltage swing($V_{osc}$); and, 3) defining the particular semiconductor manufacturing process that will be used to construct the oscillator (along with the dimensions of the device parallel to the direction of current flow (which for a CMOS process will be the channel length), the following relationships hold:

$$\Gamma_{rms} = \frac{K_{ISF}}{N_{eff}^{1.5}}, \qquad \text{EQN. 15}$$

where $K_{ISF}$ is a constant of proportionality that depends on the shape of the rising and falling waveform. For practical CMOS oscillators, $$K_{ISF} \approx \sqrt{\frac{2\pi^2}{3}}.$$

$$q_{max} = (C_{osc} + C_L)V_{osc} \qquad \text{EQN. 16,}$$

since the maximum charge is equal to the total capacitance multiplied by the voltage swing at the nodes of oscillation.

$$\frac{\overline{i_n^2}}{\Delta f} = K_n C_{OSC}, \qquad \text{EQN. 17}$$

where $K_n$ is a proportionality constant that is determined by process and circuit parameters (including the supply voltage and swing). This proportionality constant can be extracted from device noise measurements or calculated using device noise models since the supply voltage and voltage swing is known. Note that the above expression assumes that the dimension in the direction of current flow (which for a MOS device is the channel length) is fixed. The treatment can be made to account for changes in the dimension in the direction of current flow, by making the quantity $$\frac{\overline{i_n^2}}{\Delta f}$$

be a function of that dimension as well as that of $C_{osc}$. Equations 14 through 17 can be combined to express as κ as:

$$\kappa = K_{PNC} \frac{N^{0.5}}{N_{eff}^{1.5}} \frac{C_{OSC}^{0.5}}{(C_{OSC} + C_L)},$$ EQN. 18 where is $K_{PNC}$ a constant of proportionality and may be expressed in terms of the proportionality constants defined earlier as:

$$K_{PNC} = \frac{K_{ISF} K_n^{0.5}}{\omega_{OSC} V_{OSC}}.$$ EQN. 19

While the above development treated jitter, the expressions derived may also be used for phase noise expression. The single-sideband phase-noise spectrum of an oscillator due to a white-noise current source may be quantified as:

$$L(f_{off}) = \frac{N}{8\pi^2 f_{off}^2} \frac{\Gamma_{rms}^2}{q_{max}^2} \frac{\overline{i_n^2}}{\Delta f},$$ EQN. 20 where $L(f_{off})$ is the phase noise at a frequency offset from the carrier denoted by $f_{off}$, $\Gamma_{rms}$ is the root mean square value of the ISF, $q_{max}$ is the maximum charge at one node during one transition, N is the number of stages and $$\frac{\overline{i_n^2}}{\Delta f}$$

is the total current noise power spectral density per oscillating node. Substituting in from equations 15 through 18, we obtain:

$$L(f_{off}) = \frac{\omega_{OSC}^2}{8\pi^2 f_{off}^2} \kappa^2 = \frac{K_{ISF}^2 K_n}{8\pi^2 f_{off}^2 V_{OSC}^2} \frac{N}{N_{eff}^3} \frac{C_{OSC}}{(C_{OSC} + C_L)^2},$$ EQN. 21

The expressions for jitter and phase noise can be customized for CMOS process by inserting the appropriate values for $K_{ISF}$ and $K_n$.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What at is claimed is:

1. An oscillator, comprising: circuitry to affect the amount of supply current that flows through said oscillator's delay stages in order to affect delay through said delay stage; a delay stage comprising:
   a) at least two differential inputs;
   b) a pair of single ended inverters for each differential input, each pair of single ended inverters further comprising, for their corresponding differential input:
      i) a first single ended inverter whose input is coupled to a + input of said corresponding differential input;
      ii) a second single ended inverter whose input is coupled to a − input of said corresponding differential input each said first single and second single ended inverter input being coupled to only one output node of another delay stage; and,
   c) a differential output, said differential output further comprising:
      i) a + output that is coupled to each said second single ended inverter output;
      ii) a − output that is coupled to each said first single ended inverter output.

2. The oscillator of claim 1 wherein said delay stage further comprises another pair of single ended inverters between said + output and said − output, a first inverter of said another pair of single ended inverters having an input coupled to said + output and an output coupled to said − output, a second inverter of said another pair of single ended inverters having an input coupled to said − output and an output coupled to said + output.

3. The oscillator of claim 2 wherein said oscillator delay stage is part of an oscillator having an odd number of delay stages.

4. The oscillator of claim 2 wherein said oscillator delay stage is part of an oscillator having an even number of delay stages.

5. The oscillator of claim 4 where:

$$k_0 > \frac{1}{N} \sum_{i=1}^{i=(N-1)} (-1)^{(i+1)} k_i \quad \text{with } k_1 > 0$$

where:
   a) $k_0$ is the drive strength of each inverter of said another pair of single ended inverters;
   b) N is said even number of delay stages;
   c) for each integer i from 1 to M, where M is the number of differential inputs of said oscillator delay stage: $k_i$ is the drive strength of each inverter of said pair of inverters coupled to the $i^{th}$ differential input of said at least one differential input; and,
   d) for each integer i from M+1 to N−1 (if any such integers): $k_i = 0$.

6. The oscillator of claim 5 wherein:

$$k_0 > \frac{1}{N}(k_1 - k_2)$$

7. The oscillator of claim 5 wherein:

$$k_0 > \frac{1}{N}(k_1 - k_2 + k_3)$$

8. The oscillator of claim 1 wherein said oscillator that is designed as a series of N delay stages.

9. The oscillator of claim 8 wherein each delay stage within said oscillator has its differential output coupled to:
   1) its next delay stage within said series; and
   2) a delay stage that immediately follows within said series said next delay stage.

10. The oscillator of claim 9 wherein each delay stage within said oscillator has its differential output coupled to:
   1) a primary differential input of its next delay stage within said series; and 2) a secondary differential input of a delay stage that immediately follows said next delay stage within said series.

11. The oscillator of claim 1 wherein said oscillator is a voltage controlled oscillator, said voltage controlled oscillator, said circuitry comprising:
- a voltage-to-current converter, said voltage-to-current converter having an input coupled to an input of said voltage controlled oscillator;

12. The oscillator of claim 11 wherein said oscillator is part of a phase-lock-loop circuit.

13. The oscillator of claim 12 whether said oscillator delay stage further comprises another pair of single ended inverters between said + output and said − output, a first inverter of said another pair of single ended inverters having an input coupled to said + output and an output coupled to said − output, a second inverter of said another pair of single ended inverters having an input coupled to said − output and an output coupled to said + output.

14. The oscillator of claim 13 wherein said oscillator has an odd number of delay stages.

15. The oscillator of claim 13 wherein said oscillator has an even number of delay stages.

16. The oscillator of claim 15 where:

$$k_0 > \frac{1}{N} \sum_{i=1}^{i=(N-1)} (-1)^{(i+1)} k_i \quad \text{with } k_1 > 0$$

where:
a) $k_0$ is the drive strength of each inverter of said another pair of single ended inverters;
b) N is said even number of delay stages;
c) for each integer i from 1 to M, where M is the number of differential inputs of said oscillator delay stage:
  $k_i$ is the drive strength of each inverter of said pair of inverters coupled to the $i^{th}$ differential input of said at least one differential input; and,
d) for each integer i from M+1 to N−1 (if any such integers):
  $k_i = 0$.

17. The oscillator of claim 16 wherein:

$$k_0 > \frac{1}{N}(k_1 - k_2)$$

18. The oscillator of claim 16 wherein:

$$k_0 > \frac{1}{N}(k_1 - k_2 + k_3)$$

19. The oscillator of claim 12 wherein said oscillator is designed as a series of N delay stages.

20. The oscillator of claim 19 wherein each delay stage within said oscillator has its differential output coupled to;
1) its next delay stage within said series; and
2) a delay stage that immediately follows said next delay stage within said series.

21. The oscillator of claim 20 wherein each delay stage within said oscillator has its differential output coupled to:
1) a primary differential input of its next delay stage within said series; and
2) a secondary differential input of a delay stage that immediately follows said next delay stage within said series.

22. The machine readable medium having stored thereon a description of an oscillator, said oscillator comprising: circuitry to affect the amount of supply current that flows through said oscillator's delay stages in order to affect delay through said delay stages; a delay stage comprising:
a) at least one differential input;
b) a pair of single ended inverters for each differential input, each pair of single ended inverters further comprising, for their corresponding differential input:
  i) a first single ended inverter whose input is coupled to a + input of said corresponding differential input;
  ii) a second single ended inverter whose input is coupled to a − input each said first and second single ended inverter input being coupled to only one output node of another delay stage
c) a differential output, said differential output further comprising:
  i) a + output that is coupled to each said second single ended inverter output;
  ii) a − output that is coupled to each said first single ended inverter output.

23. The machine readable medium of claim 22 where said oscillator delay stage further comprises another pair of single ended inverters between said − output and said −output, a first inverter of said another pair of single ended inverters having an input coupled to said + and an output coupled to said −, a second inverter of said another pair of single ended inverters having an input coupled to said − output and an output coupled to said + output

24. The machine readable medium of claim 24 wherein said oscillator has an odd number of delay stages.

25. The machine readable medium of claim 24 wherein said oscillator has an even number of delay stages.

26. The machine readable medium of claim 25 where:

$$k_0 > \frac{1}{N} \sum_{i=1}^{i=(N-1)} (-1)^{(i+1)} k_i \quad \text{with } k_1 > 0$$

where:
a) $k_0$ is the drive strength of each inverter of said another pair of single ended inverters;
b) N is said even number of delay stages;
c) for each integer i from 1 to M, where M is the number of differential inputs of said oscillator delay stage:
  $k_i$ is the drive strength of each inverter of said pair of inverters coupled to the $i^{th}$ differential input of said at least one differential input; and,
d) for each integer i from M+1 to N−1 (if any such integers):
  $k_i = 0$.

27. The machine readable medium of claim 26 wherein:

$$k_0 > \frac{1}{N}(k_1 - k_2)$$

28. The machine readable medium of claim 26 wherein:

$$k_0 > \frac{1}{N}(k_1 - k_2 + k_3)$$

29. The machine readable medium of claim 22 wherein said oscillator has a series of N delay stages.

30. The machine readable medium of claim 29 wherein each delay stage within said oscillator has its differential output coupled to:
1) its next delay stage within said series; and
2) a delay stage that immediately follows said next delay stage within said series.

31. The machine readable medium of claim 30 wherein each delay stage within said oscillator has its differential output coupled to:
1) a primary differential input of its next delay stage within said series; and
2) a secondary differential input of a delay stage that immediately follows said next delay stage within said series.

32. The machine readable medium of claim 22 wherein said oscillator is a voltage controlled oscillator said circuit comprising:
a voltage-to-current converter, said voltage-to-current converter having an input coupled to an input of said voltage controlled oscillator 33. The machine readable medium of claim 32 wherein said voltage controller oscillator is part of a phase-lock-loop circuit.

34. The machine readable medium of claim 33 wherein said oscillator delay stage further comprises another pair of single ended inverters between said + output and said − output, a first inverter of said another pair of single ended inverters having an input coupled to said + output and an output coupled to said − output, a second inverter of said another pair of single ended inverters having an input coupled to said − output and an output coupled to said + output.

35. The machine readable medium of claim 34 wherein said oscillator has an odd number of delay stages.

36. The machine readable medium of claim 34 wherein said oscillator has an even number of delay stages.

37. The machine readable medium of claim 36 where:

$$k_0 > \frac{1}{N} \sum_{i=1}^{i=(N-1)} (-1)^{(i+1)} k_i \quad \text{with } k_1 > 0$$

where:
a) $k_0$ is the drive strength of each inverter of said another pair of single ended inverters;
b) N is said even number of delay stages; and
c) for each integer i from 1 to M, where M is the number of differential inputs of said oscillator delay stage:
$k_i$ is the drive strength of each inverter of said pair of inverters coupled to the $i^{th}$ differential input of said at least one differential input; and,
d) for each integer i from M+1 N−1 to N (if any such integers):
$k_i=0$.

38. The machine readable medium of claim 37 wherein:

$$k_0 > \frac{1}{N}(k_1 - k_2)$$

39. The machine readable medium of claim 37 wherein:

$$k_0 > \frac{1}{N}(k_1 - k_2 + k_3)$$

40. The machine readable medium of claim 33 wherein said oscillator is described as a series of N delay stages.

41. The machine readable medium of claim 40 wherein each delay stage within said oscillator has its differential output coupled to:
1) its next delay stage within said series; and
2) a delay stage that immediately follows said next delay stage within said series.

42. The machine readable medium of claim 41 wherein each delay stage within said oscillator has its differential output coupled to:
1) a primary differential input of its next delay stage within said series; and
2) a secondary differential input of a delay stage that immediately follows said next delay stage within said series.

43. The machine readable medium of claim 23 wherein said description is in the format of a transistor level netlist.

44. The machine readable medium of claim 22 wherein said description describes said oscillator as a layout for said oscillator.

* * * * *